United States Patent
Pang et al.

(10) Patent No.: US 9,230,676 B1
(45) Date of Patent: Jan. 5, 2016

(54) WEAK ERASE OF A DUMMY MEMORY CELL TO COUNTERACT INADVERTENT PROGRAMMING

(71) Applicant: SanDisk Technologies Inc., Plano, TX (US)

(72) Inventors: Liang Pang, Fremont, CA (US); Yingda Dong, San Jose, CA (US); Charles Kwong, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/612,561

(22) Filed: Feb. 3, 2015

(51) Int. Cl.
| | |
|---|---|
| *G11C 16/06* | (2006.01) |
| *G11C 16/34* | (2006.01) |
| *G11C 16/04* | (2006.01) |
| *G11C 16/14* | (2006.01) |
| *G11C 16/16* | (2006.01) |
| G11C 16/26 | (2006.01) |

(52) U.S. Cl.
CPC ........ *G11C 16/3427* (2013.01); *G11C 16/0483* (2013.01); *G11C 16/14* (2013.01); *G11C 16/16* (2013.01); *G11C 16/349* (2013.01); *G11C 16/26* (2013.01)

(58) Field of Classification Search
CPC ........... G11C 16/0483; G11C 11/5642; G11C 16/10; G11C 16/26; G11C 16/16; G11C 11/5628; G11C 11/5635; G11C 16/14
USPC .......................... 365/186.29, 185.17–185.24
See application file for complete search history.

(56) References Cited

U.S. PATENT DOCUMENTS

| | | | |
|---|---|---|---|
| 7,978,522 B2 * | 7/2011 | Kang | ................. G11C 11/5628 365/185.17 |
| 8,089,811 B2 | 1/2012 | Kang et al. | |
| 8,861,282 B2 | 10/2014 | Dutta et al. | |
| 8,867,271 B2 | 10/2014 | Li et al. | |
| 8,908,435 B2 | 12/2014 | Li et al. | |
| 9,147,492 B2 * | 9/2015 | Shim | ...................... G11C 16/10 |
| 2009/0135656 A1 | 5/2009 | Park | |

OTHER PUBLICATIONS

U.S. Appl. No. 14/465,244, filed Aug. 21, 2014, to Dong et al., "Avoiding Unintentional Program or Erase of a Select Gate Transistor."

(Continued)

*Primary Examiner* — David Lam
(74) *Attorney, Agent, or Firm* — Vierra Magen Marcus LLP

(57) ABSTRACT

A NAND string includes dummy memory cells between data memory cells and source-side and drain-side select gates. A gradual increase in threshold voltage (Vth) for the dummy memory cells which occurs due to program-erase cycles is periodically detected by a read operation at an upper checkpoint voltage. If the Vth has increased beyond the checkpoint, the control gate voltage of the dummy memory cells is decreased during subsequent erase operations of program-erase cycles, causing a gradual weak erase. A decrease in the Vth is later detected by a read operation at a lower checkpoint voltage. If the Vth has decreased too much, the control gate voltage is raised during subsequent erase operations, causing a gradual weak programming. The process can be repeated to keep the Vth within a desired range and avoid disturbs due to an increase in a channel voltage gradient which would otherwise occur.

23 Claims, 20 Drawing Sheets

(56) References Cited

OTHER PUBLICATIONS

U.S. Appl. No. 14/612,601, filed Feb. 3, 2015, to Pang et al., "Adaptive Increase in Control Gate Voltage of a Dummy Memory Cell to Compensate for Inadvertent Programming."

Ex Parte Quayle dated Sep. 18, 2015, U.S. Appl. No. 14/612,601, filed Feb. 3, 2015.

Notice of Allowance dated Nov. 23, 2015, U.S. Appl. No. 14/612,601, filed Feb. 3, 2015.

* cited by examiner

Fig. 1C

Code in storage device (150)

boot code (151)

control code / set of instructions (160)

instructions for erasing one or more memory cells in a set of data memory cells (161)

instructions for setting a first control gate voltage for first dummy memory cells during the erasing (162)

instructions for performing read operations involving the set of data memory cells (163)

instructions for determining a first count of the first dummy memory cells which have a threshold voltage above an upper checkpoint voltage (164)

instructions for setting a second control gate voltage, lower than the first control gate voltage, for the first dummy memory cells during a subsequent erase operation involving one or more memory cells in the set of data memory cells , if the first count exceeds a threshold (165)

Fig. 1D control code / set of instructions (170)

instructions for programming one or more data memory cells (171)

instructions for setting a first control gate voltage for first dummy memory cells during the programming of the one or more data memory cells (172)

instructions for performing read operations involving a set of data memory cells (173)

instructions for determining a first count of the first dummy memory cells which have a threshold voltage above an upper checkpoint voltage, after the read operations (174)

instructions for setting a second control gate voltage, higher than the first control gate voltage, for the first dummy memory cells during a subsequent programming operation involving one or more data memory cells, if the first count exceeds a threshold (175)

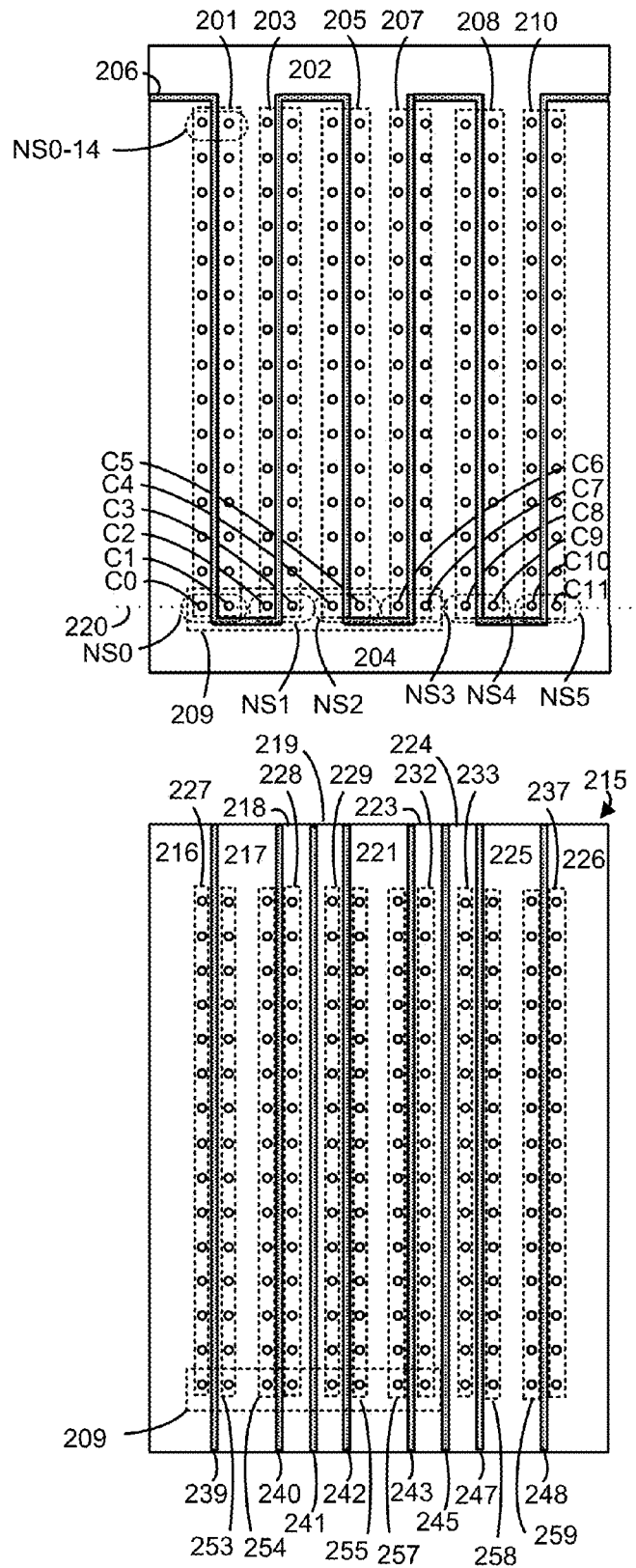

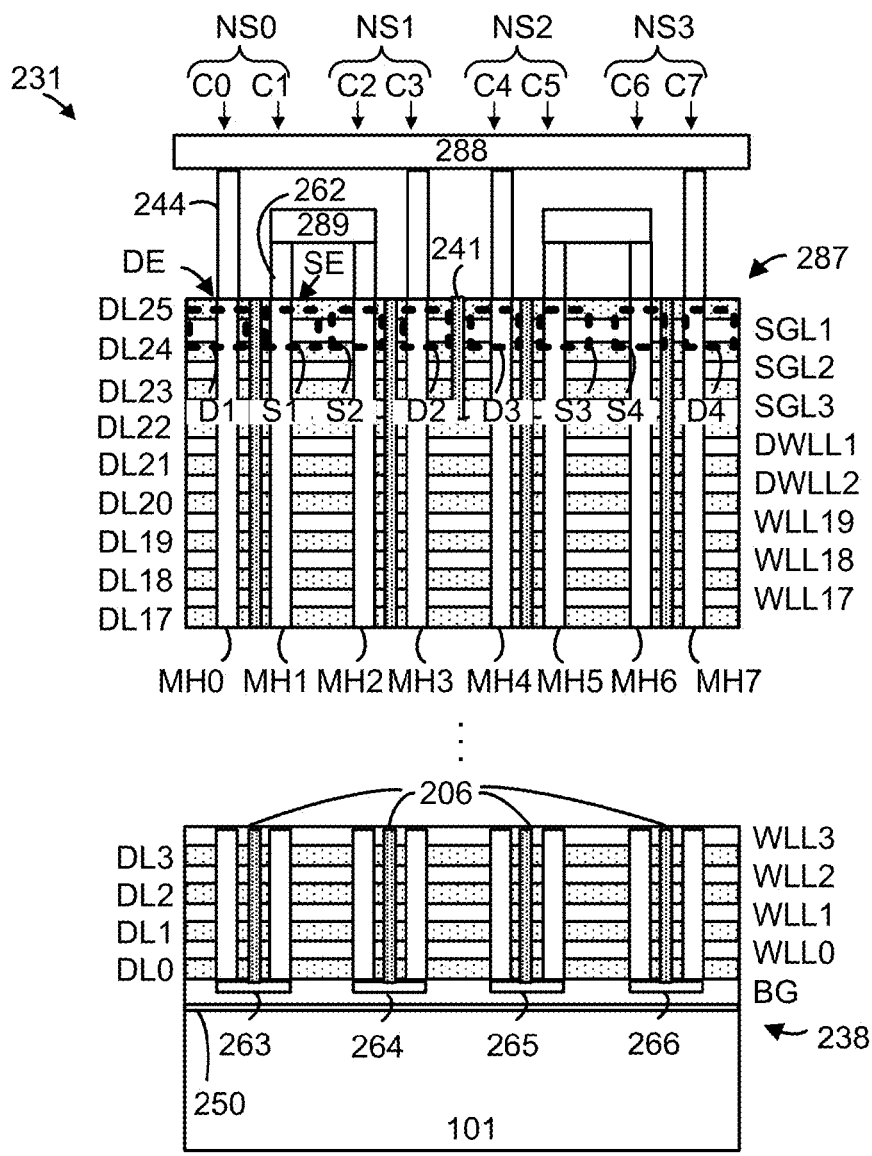

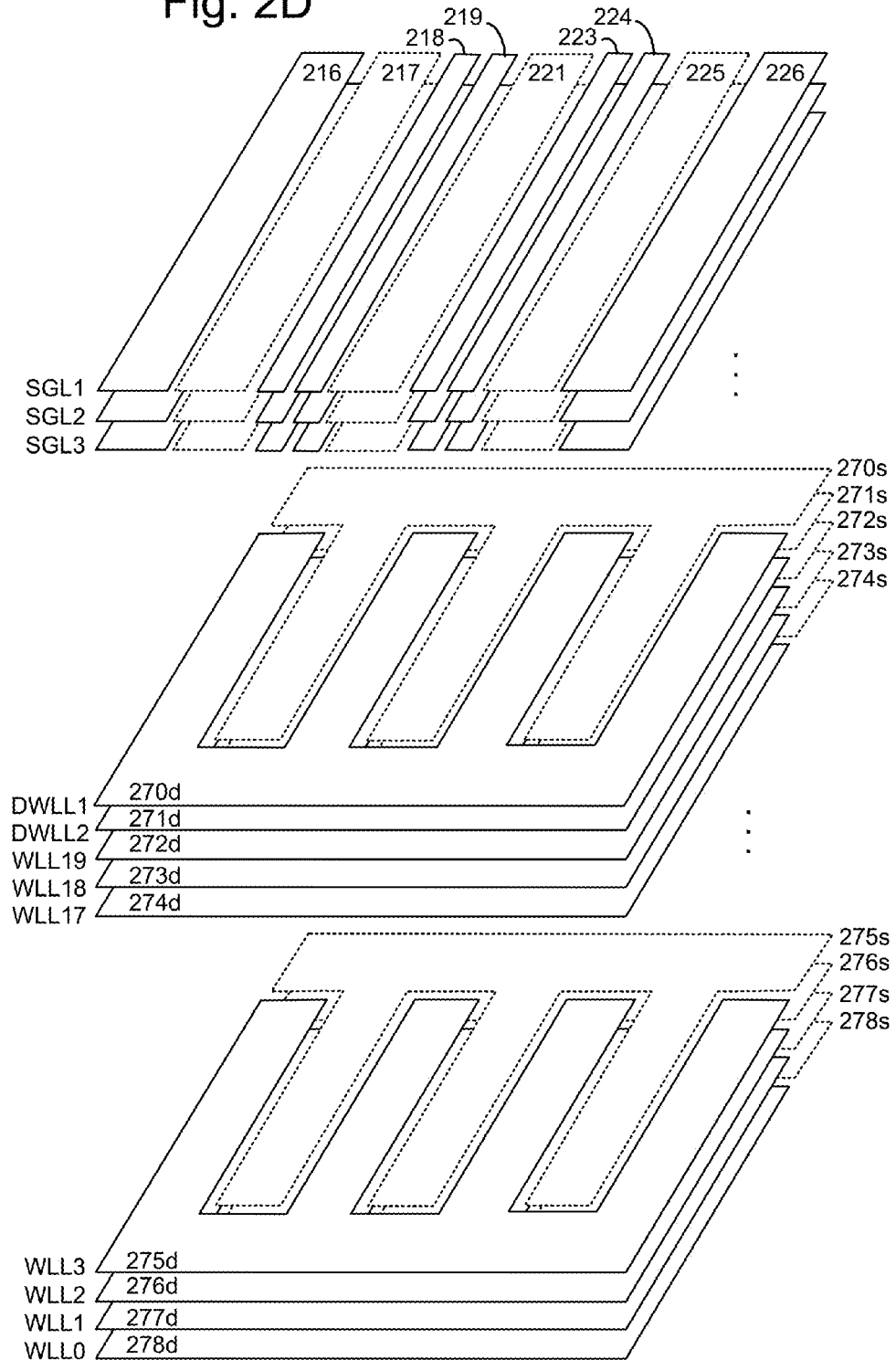

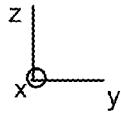
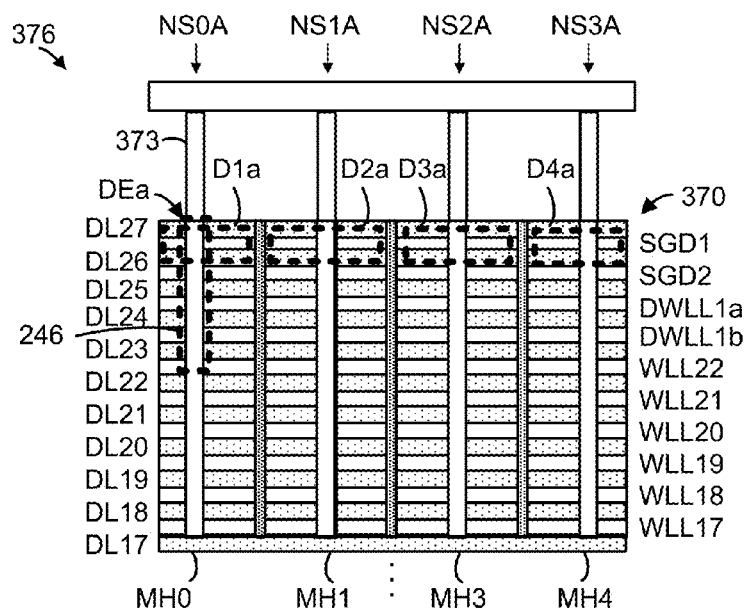
Fig. 3C1
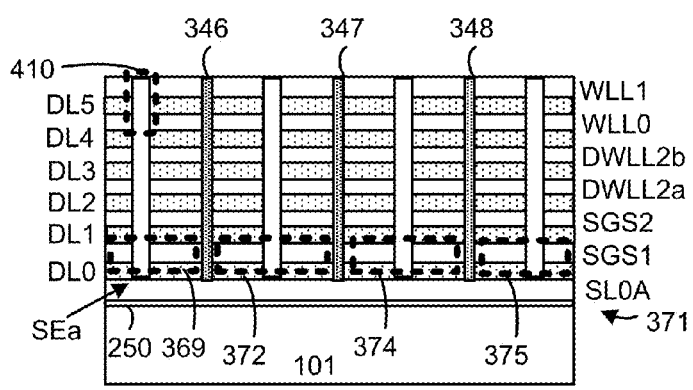
Fig. 3C2

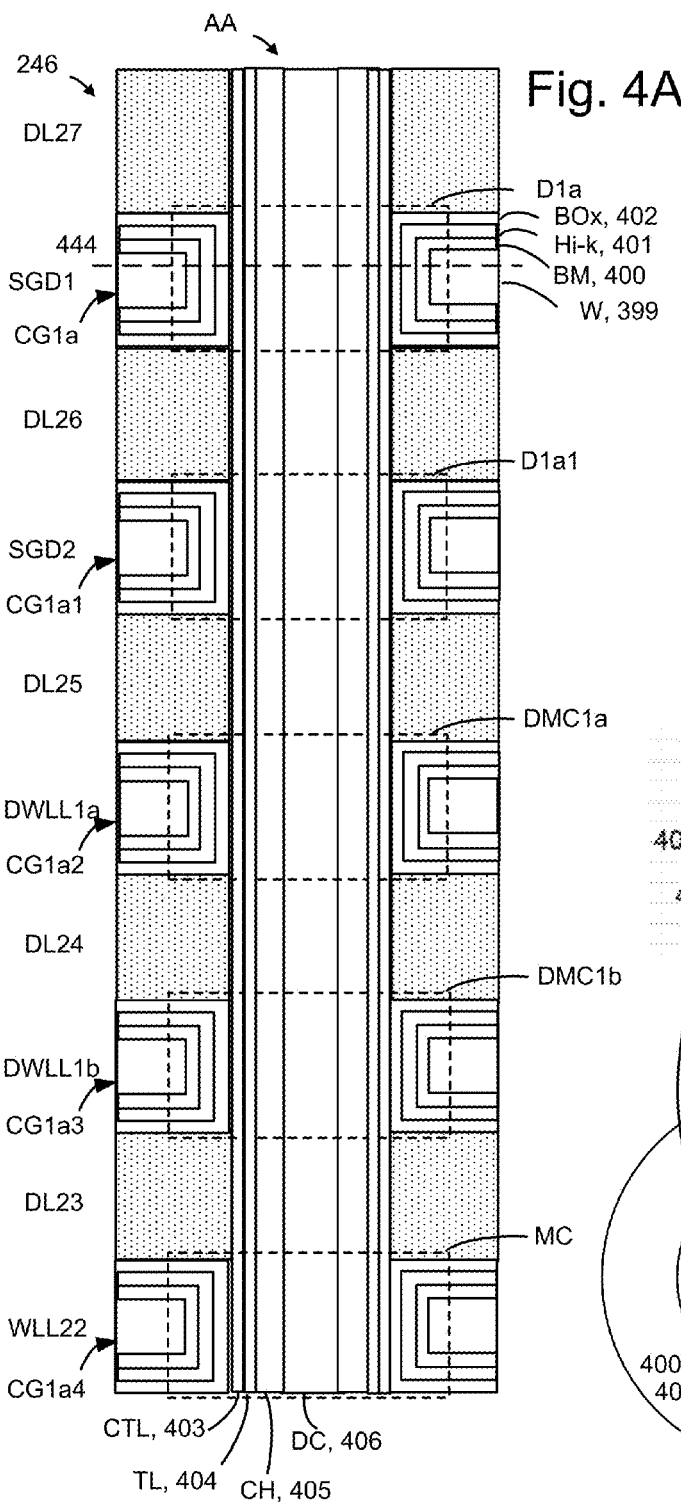
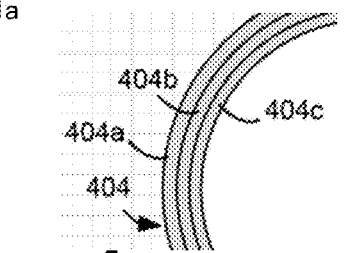
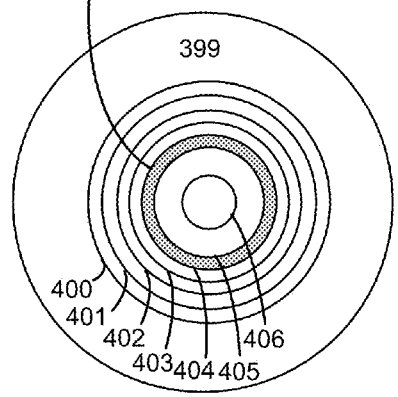

Fig. 9A

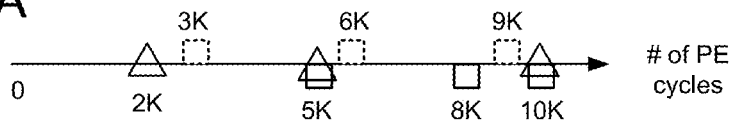

Fig. 9B

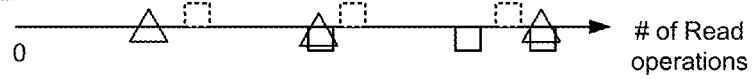

Fig. 9C

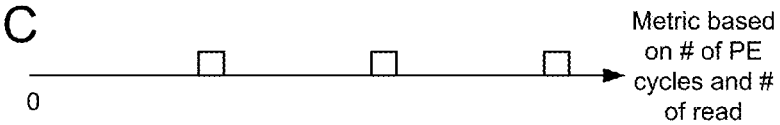

Fig. 9D

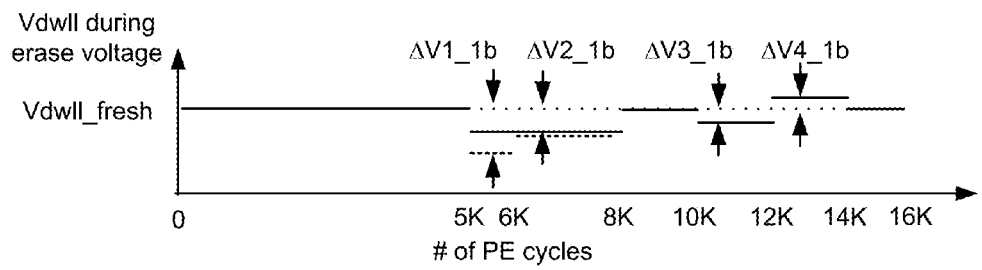

Fig. 9E    Fig. 9F

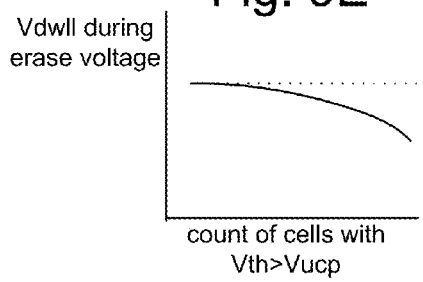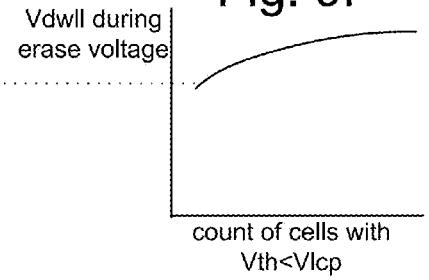

Fig. 9G

| 1st plurality of PE cycles, 1501 | 2nd plurality of PE cycles, 1502 | 3rd plurality of PE cycles, 1503 | 4th plurality of PE cycles, 1504 |
|---|---|---|---|
| program | erase | program | erase |

Fig. 9H

| 1st plurality of PE cycles, 1511 | 2nd plurality of PE cycles, 1512 | 3rd plurality of PE cycles, 1513 | 4th plurality of PE cycles, 1514 |
|---|---|---|---|
| program | strong erase | weak erase | program |

Fig. 9I

| 1st plurality of PE cycles, 1521 | 2nd plurality of PE cycles, 1522 | 3rd plurality of PE cycles, 1523 | 4th plurality of PE cycles, 1524 |
|---|---|---|---|
| program | erase | strong program | weak program |

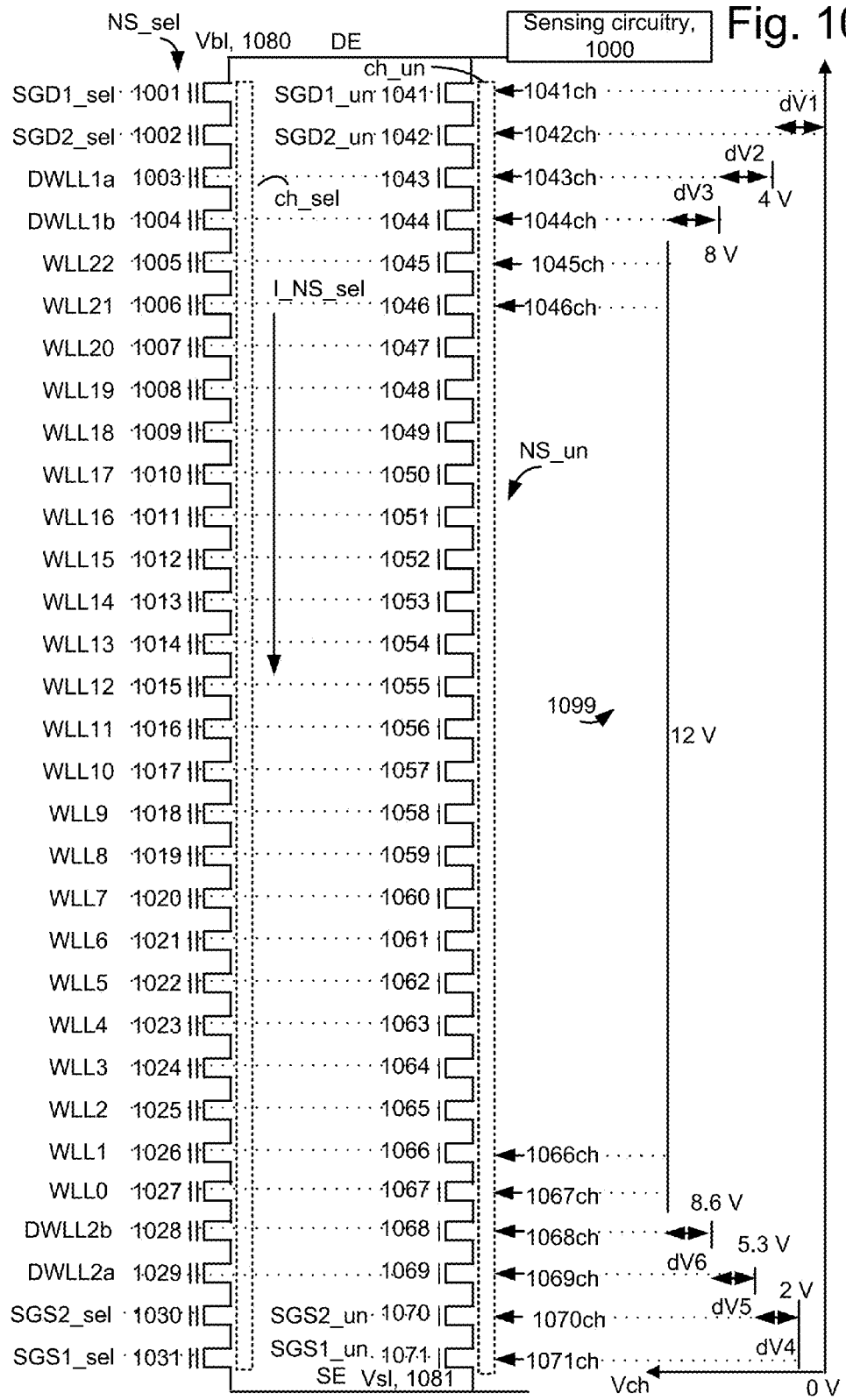

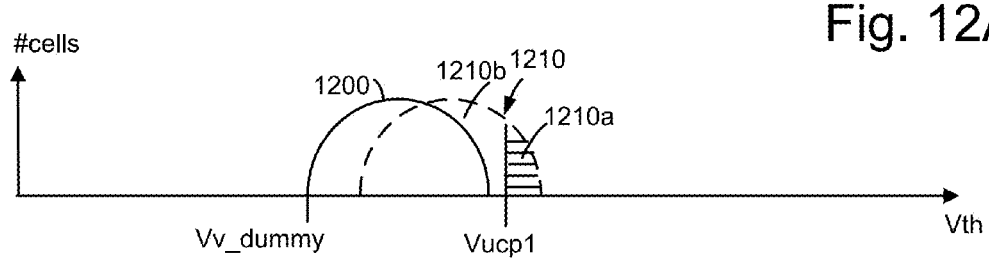
Fig. 12A
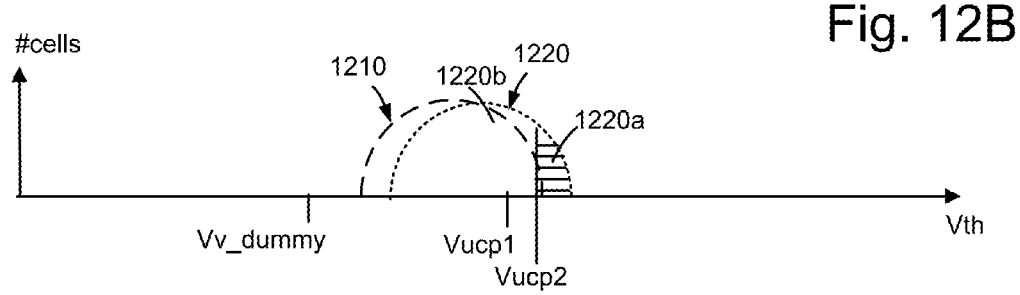
Fig. 12B
Fig. 12C
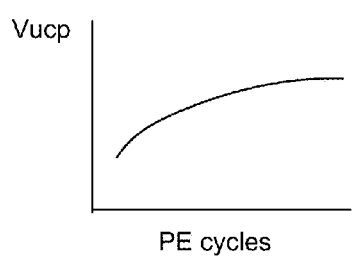
Fig. 12D
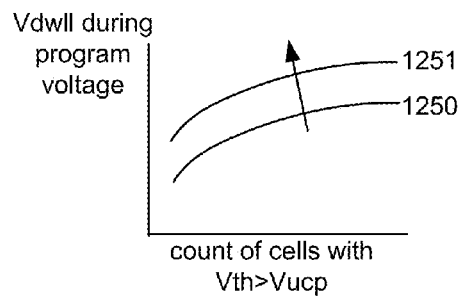

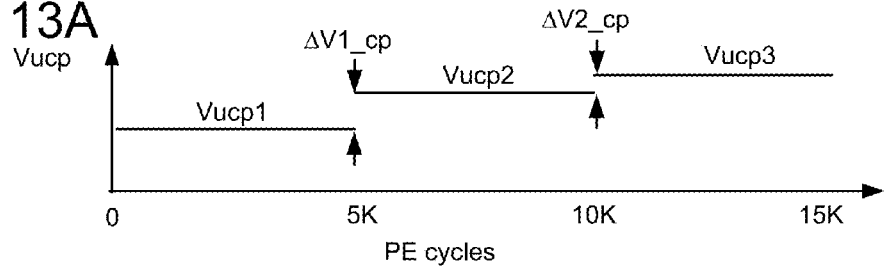
Fig. 13A
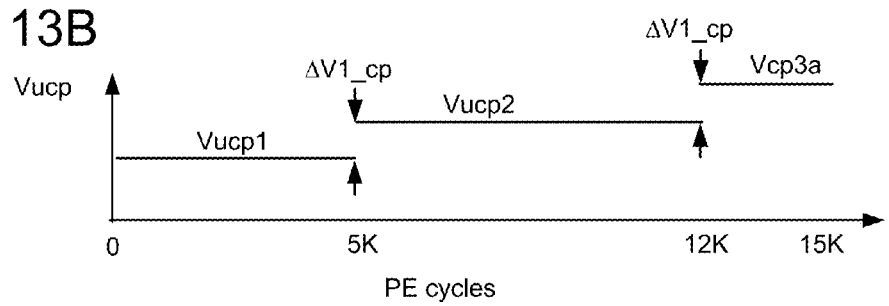
Fig. 13B
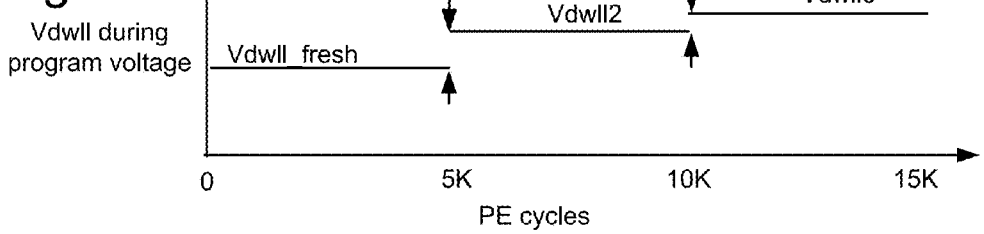
Fig. 13C
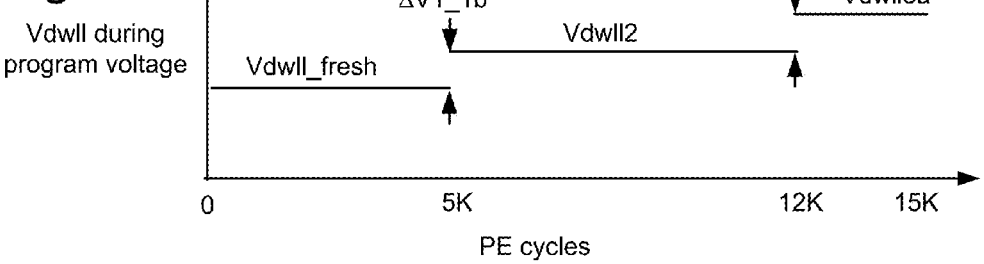
Fig. 13D
Fig. 13E
| 1st plurality of PE cycles, 1531 | 2nd plurality of PE cycles, 1532 | 3rd plurality of PE cycles, 1533 |
|---|---|---|
| Vdwll_fresh | Vdwll2 | Vdwll3 |

WEAK ERASE OF A DUMMY MEMORY CELL TO COUNTERACT INADVERTENT PROGRAMMING

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C depicts example code which may be executed by a processor.

FIG. 1D depicts additional example code which may be executed by a processor.

FIG. 2A depicts a top view of example word line layers 202 and 204 in a U-shaped NAND embodiment, as an example implementation of BLK0 in FIG. 1A.

FIG. 2B depicts a top view of example select gate layer portions, consistent with FIG. 2A.

FIG. 2C depicts an embodiment of a stack 231 showing a cross-sectional view of the portion 209 of FIG. 2A, along line 220, where three select gate layers, SGL1, SGL2 and SGL3 are provided.

FIG. 2D depicts an alternative view of the select gate layers and word line layers of the stack 231 of FIG. 2C.

FIG. 3C1 depicts an embodiment of a stack 376 showing a cross-sectional view of the portion 307 of FIG. 3A, along line 305, where two SGD layers, two SGS layers and dummy word line layers DWLL1a, DWLL1b, DWLL2a and DWLL2b are provided.

FIG. 3C2 depicts a variation in the width of a memory hole along its height.

FIG. 4A depicts a view of the region 246 of FIG. 3C1, showing SGD transistors D1a (consistent with FIG. 3C1) and D1a1 above dummy memory cells DMC1a and DMC1b and a data memory cell MC.

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 9A depicts an example time line showing when a criterion is met for evaluating dummy memory cells as a function of a number of program-erase (PE) cycles, consistent with steps 601, 616 and 633 of FIGS. 6A, 6B and 6C, respectively.

FIG. 9B depicts an example time line showing when a criterion is met for evaluating dummy memory cells as a function of a number of read operations, consistent with steps 601, 616 and 633 of FIGS. 6A, 6B and 6C, respectively.

FIG. 9C depicts an example time line showing when a criterion is met for evaluating dummy memory cells as a function of a metric which is based on a number of PE cycles and a number of read operations, consistent with steps 601, 616 and 633 of FIGS. 6A, 6B and 6C, respectively.

FIG. 9D depicts an example of a dummy word line voltage during an erase pulse as a function of a number of PE cycles, consistent with the process of FIG. 6B.

FIG. 9E depicts an example of a dummy word line voltage during an erase voltage which is inversely proportional to a count of a number of dummy memory cells having Vth>Vucp, an upper check point voltage, consistent with the process of FIG. 6B.

FIG. 9F depicts an example of a dummy word line voltage during an erase voltage which is proportional to a count of a number of dummy memory cells having Vth<Vlcp, a lower check point voltage, consistent with the process of FIG. 6B.

FIG. 9G depicts an example sequence of program-erase cycles in which programming of dummy memory cells (PE cycles 1501 and 1503) alternates with erasing (PE cycles 1502 and 1503), consistent with FIG. 9D.

FIG. 9H depicts an example sequence of PE cycles comprising programming of dummy memory cells (PE cycles 1511), strong erasing (PE cycles 1512), weak erasing (PE cycles 1513) and programming (PE cycles 1514), consistent with FIG. 9D.

FIG. 9I depicts an example sequence of PE cycles comprising programming of dummy memory cells (PE cycles 1521), erasing (PE cycles 1522), strong programming (PE cycles 1523) and weak programming (PE cycles 1524), consistent with FIG. 9D.

FIG. 10A depicts a circuit diagram of a selected NAND string (NS_sel) and an unselected NAND string (NS_un), consistent with the memory devices of FIGS. 2C and 3C1.

FIG. 12A depicts an initial Vth distribution 1200 and a subsequent Vth distribution 1210 of dummy memory cells, and a first upper checkpoint voltage Vucp1, consistent with the process of FIG. 6C.

FIG. 12B depicts the subsequent Vth distribution 1210 and a further Vth distribution 1220 of dummy memory cells, and a second upper checkpoint voltage Vucp2, consistent with the process of FIG. 6C.

FIG. 12C depicts a plot of an upper checkpoint voltage Vucp as a function of PE cycles, consistent with the process of FIG. 6C.

FIG. 12D depicts a plot of Vdwll which is a function of a count of dummy memory cells with Vth>Vucp, and a function of Vucp, consistent with the process of FIG. 6C.

FIG. 13A depicts a plot of Vucp as a function of PE cycles, where the PE cycles in which the dummy memory cells are evaluated are equally spaced and Vucp increases by progressively smaller steps.

FIG. 13B depicts a plot of Vucp as a function of PE cycles, where the PE cycles in which the dummy memory cells are evaluated are spaced by progressively larger amounts and Vucp increases by equal steps.

FIG. 13C depicts a plot of Vdwll as a function of PE cycles, consistent with FIG. 13A, where PE cycles in which the dummy memory cells are evaluated are equally spaced and Vdwll increases by progressively smaller steps.

FIG. 13D depicts a plot of Vdwll as a function of PE cycles, consistent with FIG. 13B, where the PE cycles in which the dummy memory cells are evaluated are spaced by progressively larger amounts and Vdwll increases by equal steps.

FIG. 13E depicts an example sequence of PE cycles in Vdwll is set at Vdwll_fresh (PE cycles 1531), Vdwll2 (PE cycles 1532) and Vdwll3 (PE cycles 1533), consistent with FIG. 13C.

DETAILED DESCRIPTION

Figure 1A:
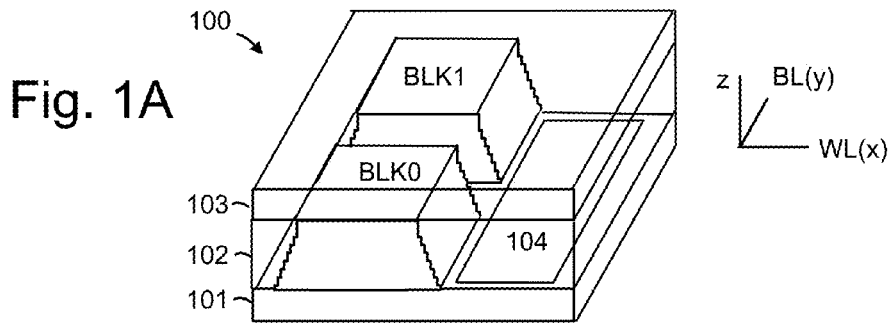
FIG. 1A is a perspective view of a 3D stacked non-volatile memory device.

Techniques are provided for maintaining the threshold voltage of dummy memory cells in a charge-trapping memory device within a defined range, by counteracting inadvertent programming of the dummy memory cells.

A charge-trapping memory device may use a charge-trapping material such as silicon nitride or other nitride, or in a multi-layer configuration such as an oxide-nitride-oxide (O-N-O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string.

Further, dummy memory cells can be provided in such NAND strings. Dummy memory cells do not store data, and are not eligible to store data, but provide a transition region between a select gate and memory cells (e.g., data memory cells) which are eligible to store data. This transition region allows for a more gradual increase in channel voltage between a portion of the channel which is directly under a select gate and a portion of the channel which is directly under a data memory cell. This gradual increase helps avoid electron-hole generation which can lead to a disturb, e.g., an inadvertent threshold voltage (Vth) increase, of the data memory cell in an unselected NAND string. The data memory cell which is closest to the select gate can be most vulnerable to this disturb. Electron-hole generation due to a channel gradient is observed in a polysilicon channel, for instance. The disturb is caused by the electrons enter a charge-trapping layer of the data memory cell in a process referred to as hot electron injection.

However, the Vth of the dummy memory cells can change gradually over time. In one theory, a weak programming occurs during erase operations for the data memory cells. During the erase operations, the channel of the NAND string is charged up from the drain end, e.g., by gate-induced dram leakage (GIDL) at the drain-side select gate transistor, while a control gate voltage (Vdwll) is applied to the dummy memory cell. GIDL can also occur at the source-side select gate transistor. The GIDL can be caused by applying a relatively high erase voltage to the drain end via a bit line, for example.

When GIDL occurs, holes are generated which diffuse through the channel and charge up the channel. However, it takes some time for the holes to be generated and diffuse, so that the channel voltage (Vch) can be initially very low. As a result, when the erase voltage is first applied to the end of the NAND string, and while Vdwll is applied to the dummy memory cell, the gate-to-channel voltage of the dummy memory cell is relatively high, so that a weak programming (e.g., an increase in Vth) of the dummy memory cell can occur. Moreover, when the channel is fully charged, the Vch directly under the dummy memory cell will be lower due to the increase in Vth of the dummy memory cell, since Vch=Vcg−Vth of the dummy memory cell. The Vch under the data memory cells remains the same, so that there can be an increase in the difference between the Vch under the data memory cell and the Vch under the dummy memory cell. This increases the gradient in the channel and the likelihood of electron-hole generation, which can lead to a disturb of the data memory cell, as discussed.

The disturbs which are experienced by a data memory cell can accumulate over a number of program-erase (PE) cycles until the data in the data memory cell is unreadable. For example, a disturb may cause a data memory cell to transition from the erased state to the lowest programmed state (e.g., the A state).

In another theory, the Vth of a dummy memory cell is gradually increase due to sensing operations of data memory cells. A sensing operation can include a read operation in which the data state of a memory cell is determined after the cell has been programmed, and a verify operation in which a determination is made during programming as to whether the Vth of a memory cell exceeds a verify voltage of an associated target data state to which the memory cell is being programmed. During a sensing operation, the dummy memory cell receives a pass voltage which can induce weak programming.

To avoid unacceptable increases in the Vth of a dummy memory cell over the lifetime of the memory device as PE cycles and/or read operations are performed, techniques are provided which maintain the Vth within a defined range. In one approach, a gradual increase in the Vth is periodically detected by a read operation at an upper checkpoint voltage (Vucp). If a count of dummy memory cells having a Vth above the upper checkpoint voltage exceeds a threshold, a countermeasure is imposed by decreasing the Vwldd of the dummy memory cells during subsequent erase operations. This causes a gradual weak erase over a number of subsequent PE cycles. Moreover, the decrease in the Vth can be later detected by a read operation at a lower checkpoint voltage (Vlcp). If the Vth has decreased past the lower checkpoint voltage, Vwldd can be raised during subsequent erase operations, causing a gradual weak programming over a number of subsequent PE cycles. The process can be repeated to keep the Vth within the desired range.

Various options are possible. For example, to induce a weak erase, the Vwldd may be set to be inversely proportional to the count of dummy cells with Vth above the upper checkpoint voltage. That is, the weak erase countermeasure is made relatively stronger when the count of dummy cells with Vth above the upper checkpoint voltage is relatively higher. This helps bring the Vth back into the desired range faster. Similarly, to induce a weak programming, the Vcg may be set to be proportional to the count of dummy cells with Vth below the lower checkpoint voltage. That is, the weak programming countermeasure is made relatively stronger when the count of dummy cells with Vth below the lower checkpoint voltage is relatively higher. This also helps bring the Vth back into the desired range faster.

In another option, the Vwldd which causes weak programming can be inversely proportional to the count of dummy memory cells which exceeds the upper checkpoint voltage. That is, the weak programming countermeasure is made relatively weaker when the count of dummy cells with Vth above the upper checkpoint voltage in a previous evaluation of the dummy memory cells is relatively higher. In this situation, the dummy memory cells are considered to be relatively fast programming so that Vwldd is made relatively lower during the weak programming to avoid exceeding the upper checkpoint voltage again too quickly.

Similarly, the Vwldd which causes weak erase can be inversely proportional to the count of dummy memory cells which exceeds the lower checkpoint voltage. That is, the weak erase countermeasure is made relatively weaker when the count of dummy cells with Vth below the lower checkpoint voltage is relatively higher. In this situation, the dummy memory cells are considered to be relatively fast erasing so that Vcg is made relatively lower during the weak erase to avoid falling below the lower checkpoint voltage again too quickly.

In another option, during the weak erase, Vcg is initially decreased by a relatively large amount to cause a strong erase which returns the Vth to the desired range relatively quickly. The Vcg is then increased slightly to a level which causes a weak erase.

The reading of the dummy memory cells can occur when specific criterion is met, such as passage of a number of PE cycles or a number of read operations. Moreover, after an evaluation of the Vth, a time for the next evaluation can be set adaptively. In one approach, if the reading indicates the Vth is within the acceptable range, the time for the next evaluation can be set further away than if the reading indicates the Vth is not within the acceptable range. In the latter case, it may be desirable to evaluated the dummy memory cells more often to ensure the countermeasure is effective in keeping the Vth within the allowable range.

Techniques are also provided for compensating for an increase in the Vth of dummy memory cells in a charge-trapping memory device. In this case, the Vth is allowed to increase gradually over time. In one approach, the dummy memory cells are periodically read to determine whether their Vth has increased above an upper checkpoint voltage. If this is true, the control gate voltage (Vdwll) of the dummy memory cells is increased during program pulses of subsequent program operations. This helps maintain the channel voltage under the dummy memory cells at a fixed level to avoid a channel gradient which causes disturbs. The reading and increasing of the control gate voltage can be periodically repeated using higher upper checkpoint voltages until the control gate voltage reaches a maximum allowed level. At this time, the dummy memory cells are erased and reprogrammed.

The increment in the upper checkpoint voltage (Vucp) can be set in different ways. In one approach, Vucp is incremented with progressively smaller steps as a function of increasing PE cycles to match an expected behavior of the Vth of the dummy memory cells.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells (storage elements) and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
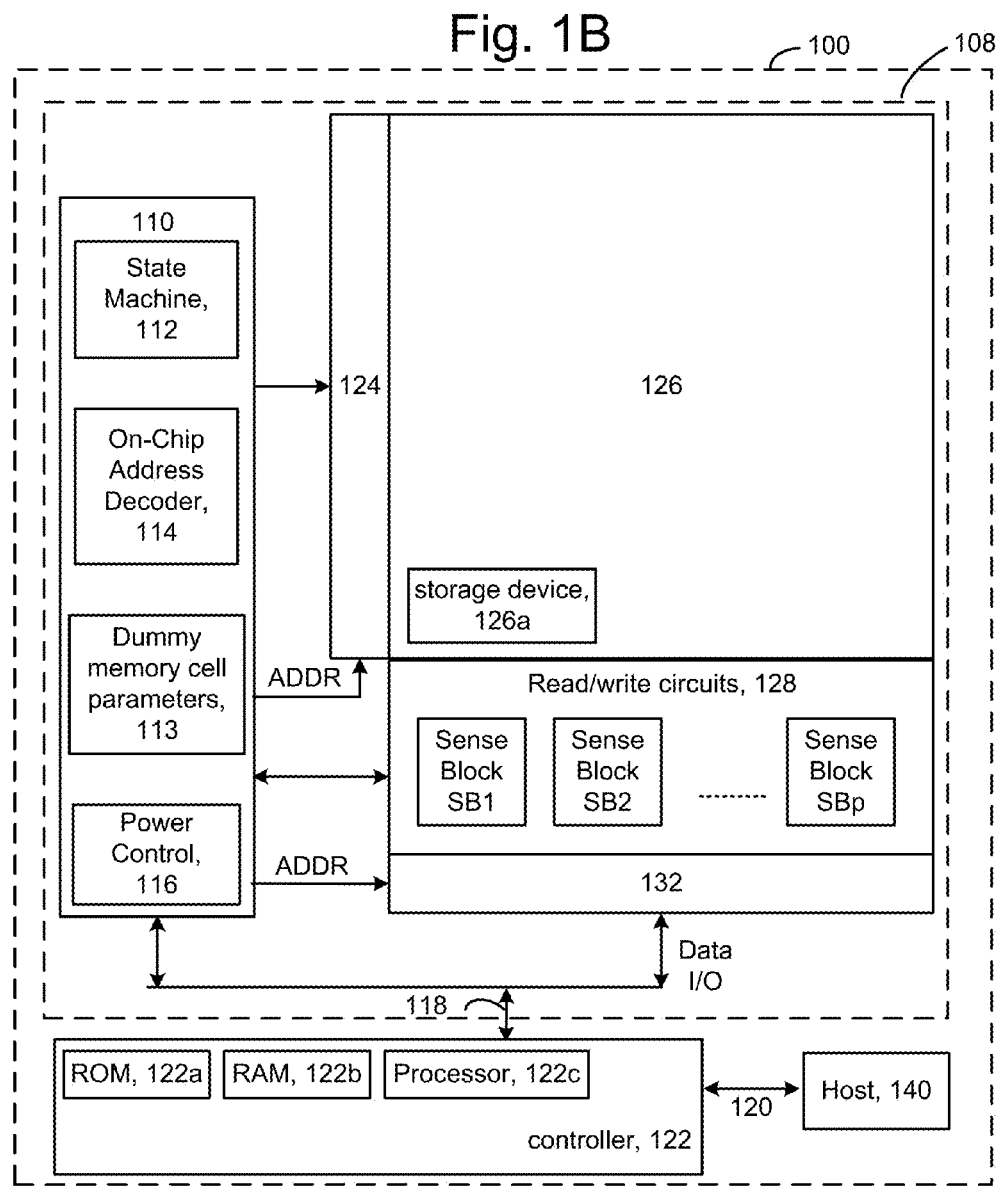
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for controlling the dummy memory cells. These can include parameters for adjusting the Vth and/or control gate voltages of dummy memory cells, for example, as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp, read/write circuits 128, controller 122, and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1C depicts example code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The set of instructions can include instructions for erasing one or more memory cells in a set of data memory cells (161), instructions for setting a first control gate voltage for first dummy memory cells during the erasing (162), instructions for performing read operations involving the set of data memory cells (163), instructions for determining a first count of the first dummy memory cells which have a threshold voltage above an upper checkpoint voltage (164), and instructions for setting a second control gate voltage, lower than the initial control gate voltage, for the first dummy memory cells during a subsequent erase operation involving one or more memory cells in the set of data memory cells, if the first count exceeds a threshold (165).

FIG. 1D depicts additional example code or set of instructions 170 which may be executed by a processor. The set of instructions includes instructions for programming one or more data memory cells (171), instructions for setting a first control gate voltage for first dummy memory cells during the programming of the one or more data memory cells (172), instructions for performing read operations involving a set of data memory cells (173), instructions for determining a first count of the first dummy memory cells which have a threshold voltage above an upper checkpoint voltage, after the read operations (174), and instructions for setting a second control gate voltage, higher than the first control gate voltage, for the first dummy memory cells during a subsequent programming operation involving one or more data memory cells, if the first count exceeds a threshold (175).

Figure 6A:
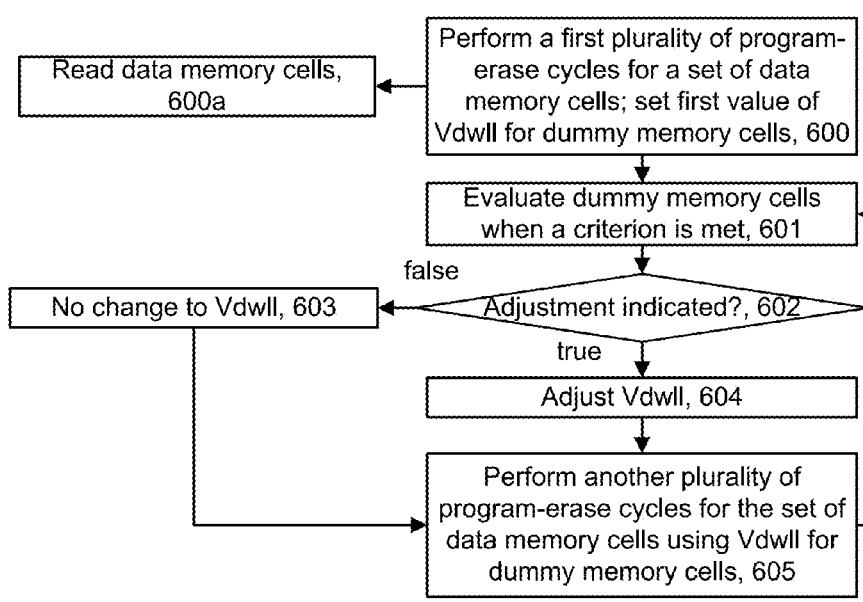
FIG. 6A depicts an example process for controlling dummy memory cells during program and erase operations.
Figure 6B:
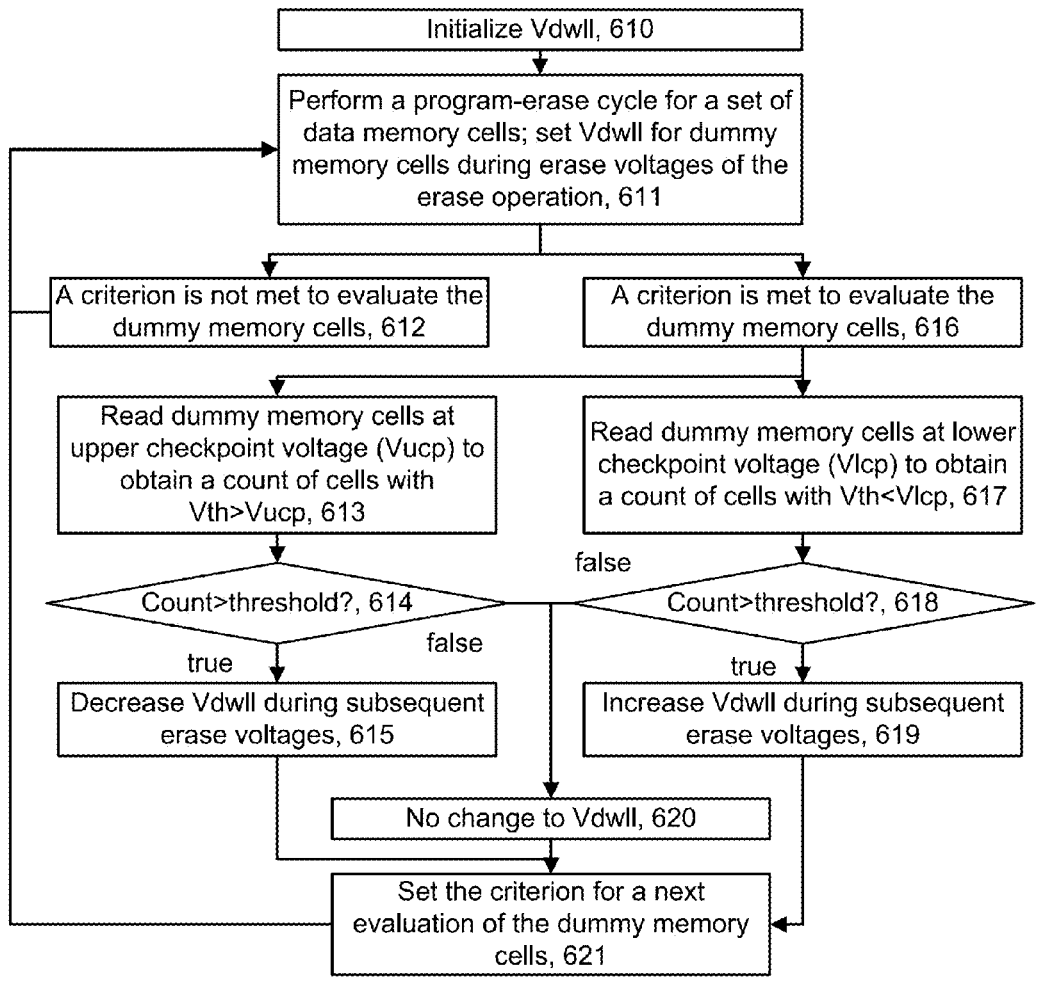
FIG. 6B depicts an example process consistent with FIG. 6A for adjusting the Vth of dummy memory cells to maintain the Vth in a defined range.
Figure 6C:
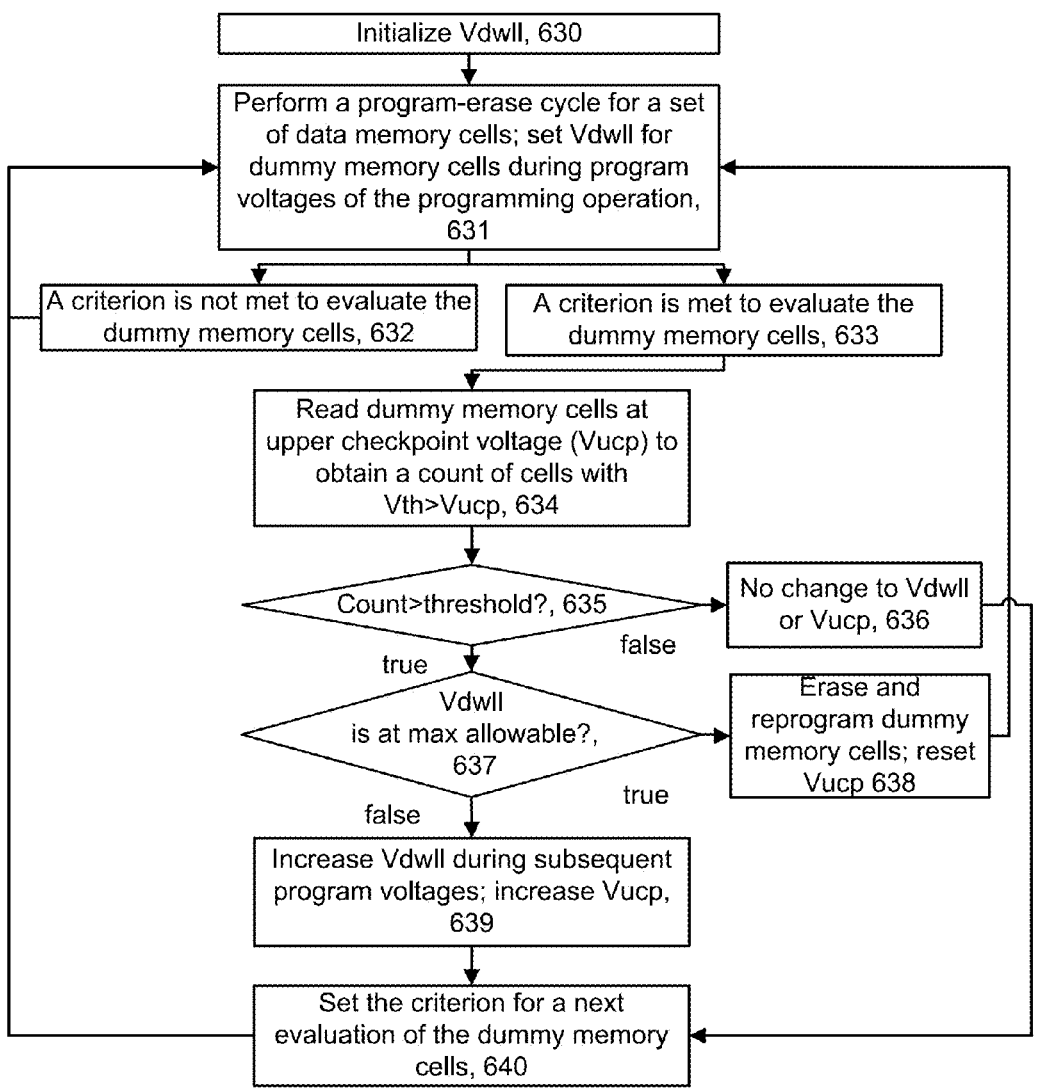
FIG. 6C depicts an example process consistent with FIG. 6A for compensating for an increase in the Vth of dummy memory cells.

Generally, the control code can include instructions to perform the functions described herein including the steps of the processes of FIGS. 6A, 6B and 6C.

Other types of non-volatile memory in addition to NAND flash memory can also be used.

Semiconductor memory devices include volatile memory devices, such as dynamic random access memory ("DRAM")

or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data word line layers WLL0 to WLL19, dummy word line layers DWLL1 and DWLL2, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

As mentioned, a dummy memory cell, also referred to as a non-data memory cell, does not store data, while a data memory cell is eligible to store data. Thus, data memory cells may be programmed to store write data. After a block is erased, all data memory cells are in the erased state. As some word lines are programmed, the corresponding data memory cells store data while other data memory cells do not store data. As a remainder of the block is programmed, all data memory cells typically store data.

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270d, 271d, 272d, 273d and 274d, respectively, and source-side word lines 270s, 271s, 272s, 273s and 274s, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

Figure 3A:
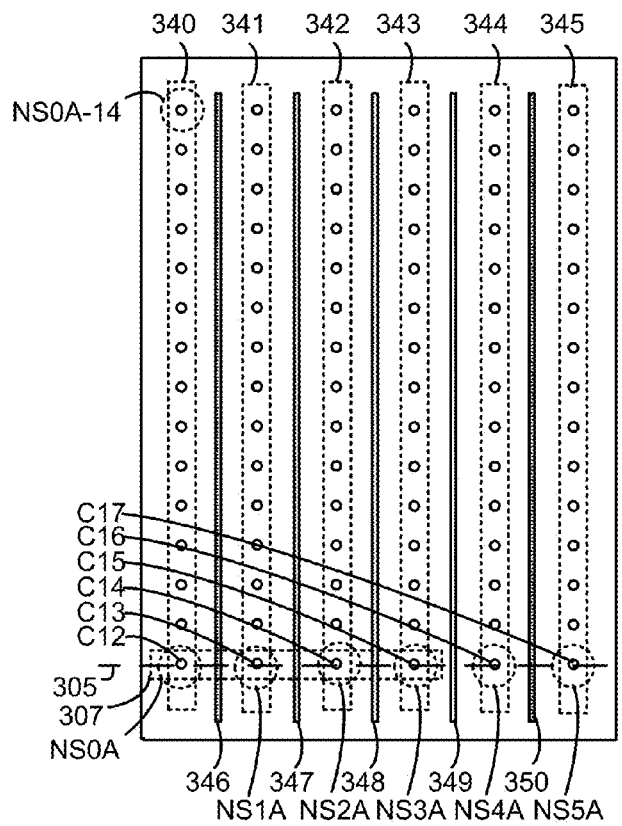
FIG. 3A depicts a top view of an example word line layer 304 of the block BLK0 of FIG. 1A, in a straight NAND string embodiment.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

Figure 3B:
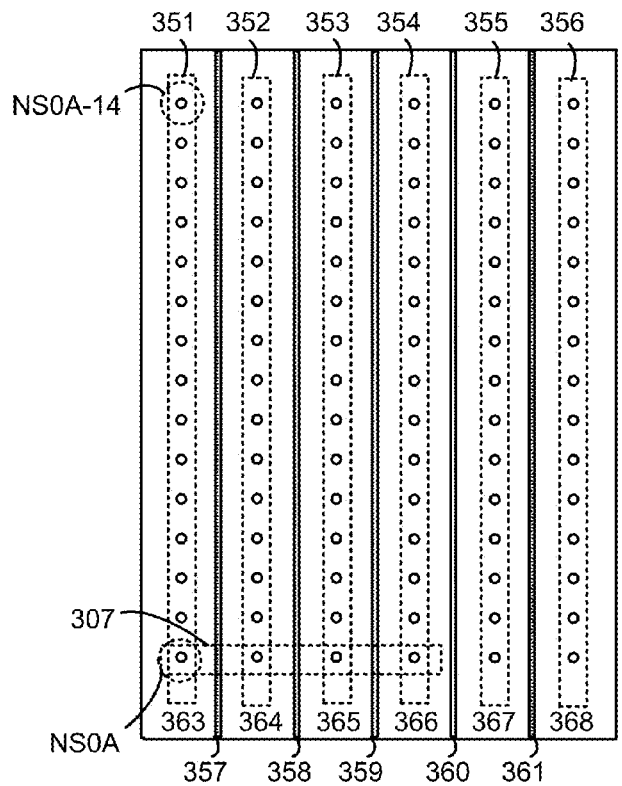
FIG. 3B depicts a top view of an example SGD layer 362, consistent with FIG. 3A.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where two SGD layers, two SGS layers and four dummy word line layers DWLL1a, DWLL1b, DWLL2a and DWLL2b are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A. A region 410 of the stack is also shown. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, and a width of the vertically-extending memory holes varies along a height of the memory device.

Figure 3D:
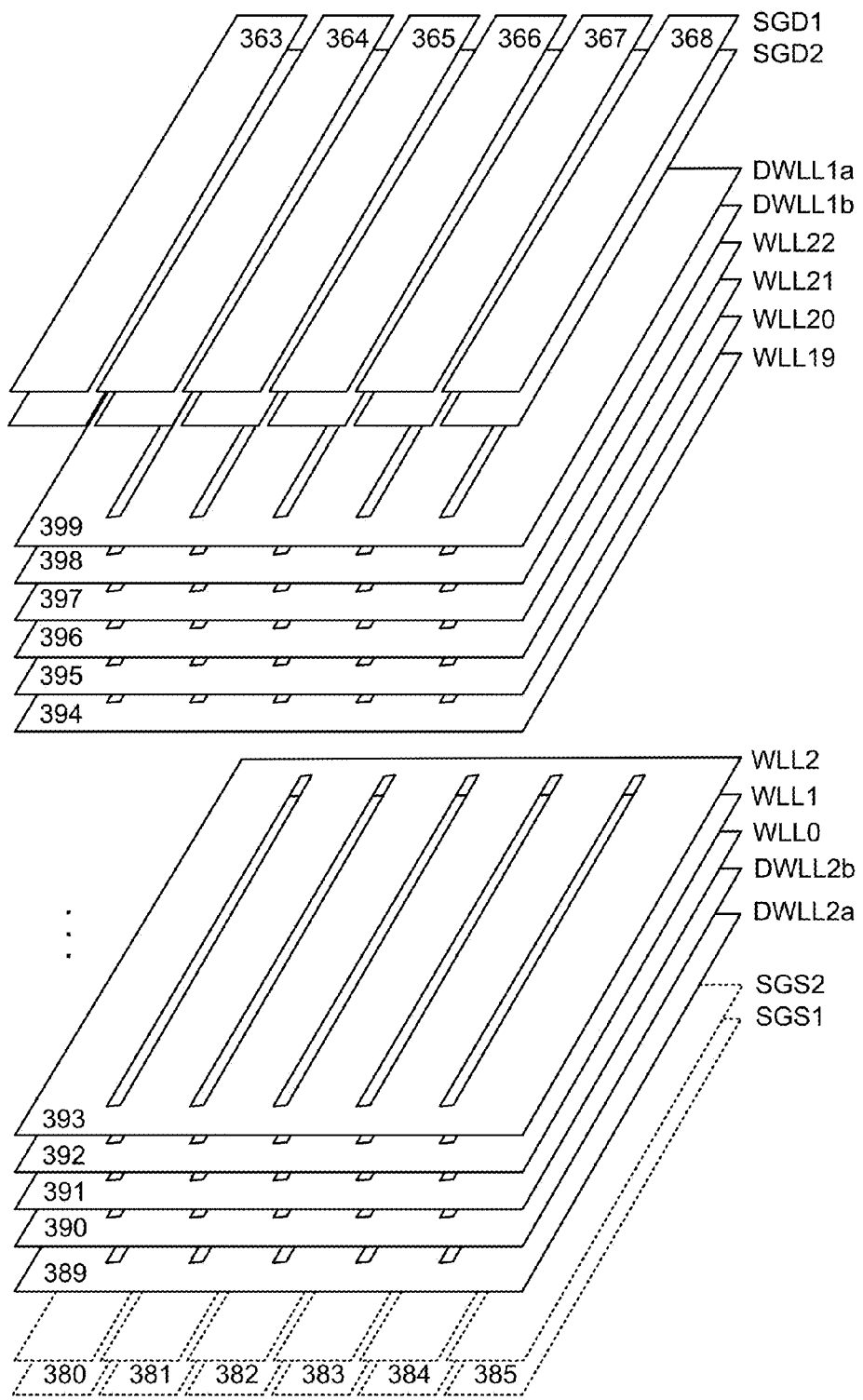
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL1a, DWLL1b, WLL22, WLL21, WLL20 and WLL19 represent word lines 399, 398, 397, 396, 395 and 394, respectively. WLL2, WLL1, WLL0, DWLL2b and DWLL2a represent word lines 393, 392, 391, 390 and 389, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a (consistent with FIG. 3C1) and D1a1 above dummy memory cells DMC1a and DMC1b and a data memory cell MC. A number of layers can be deposited along the sidewalls of the column and within each word line layer. These layers can include oxide-nitride-oxide (O-N-O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a and D1a1, the dummy memory cell DMC1a and DMC1b, and the memory cell MC, respectively. In another approach, all of these layers except the metal are provided in the column. Additional memory cells are similarly formed throughout the columns. The layers in the memory hole form a columnar active area (AA) of the NAND string.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

Figure 5A:
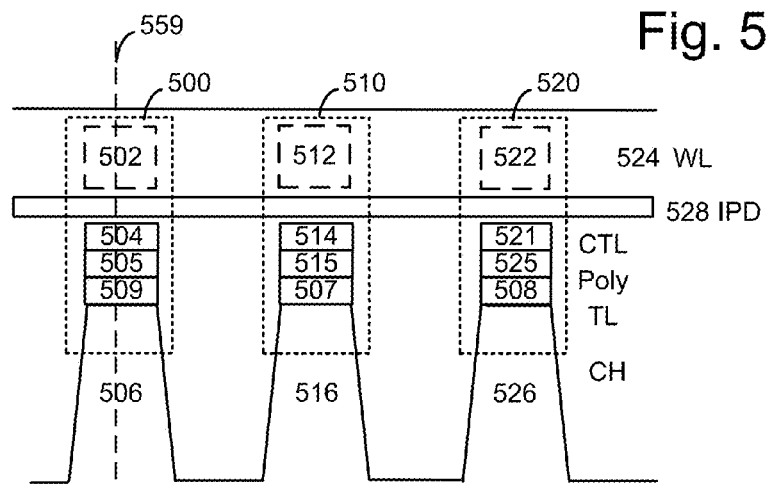
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunneling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
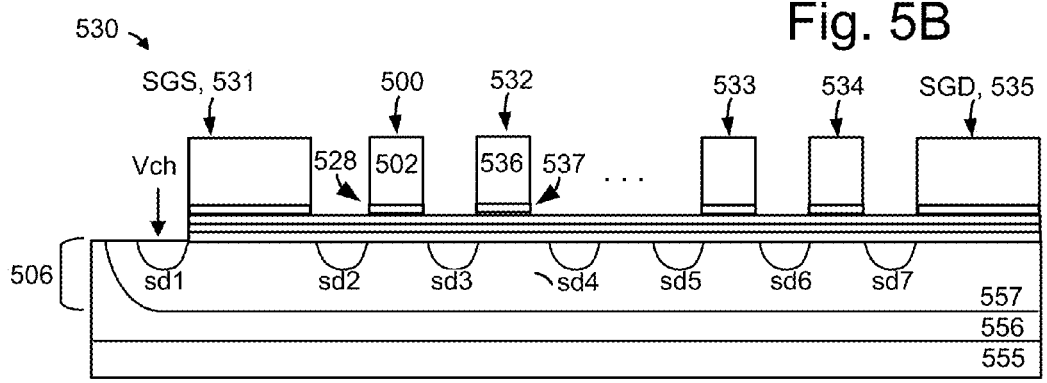
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example memory cells 500, 532, . . . , 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and an IPD portion 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the memory cells but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

One or more dummy memory cells may be provided adjacent to the select gate transistors.

FIG. 6A depicts an example process for controlling dummy memory cells during program and erase operations. Step 600 involves performing a first plurality of program-erase (PE) cycles for a set of data memory cells, and setting a first value of Vdwll on the control gates of the dummy memory cells. A PE cycle involves a programming operation followed by an erase operation for data memory cells. Vdwll represents a generic dummy word line voltage. In some cases, multiple adjacent dummy memory cells are provided. In such cases, Vdwll can be optimized for dummy memory cell in a NAND string. Moreover, a set of dummy memory cells which are connected to a same word line or word line layer will receive a common voltage. Step 600a include reading the data memory cells. A set of data memory cells may be read one or multiple times after being programmed. For example, if a memory device stores images in a camera, the memory device is read each time the user views the image on a display screen of the camera. In other cases, a set of data memory cells may not be read after being programmed. For example, a backup copy of a file may be stored, where the file is never accessed and is erased at a later time.

Step 601 involves performing an evaluation of the dummy memory cells when a criterion is met, such as when a specified number of PE cycles have passed. This evaluation can involve, e.g., determining an upper extent of an upper tail of a Vth distribution of the dummy cells, and/or a lower extent of a lower tail of the Vth distribution of the dummy cells. The criterion can be determined, and the read can be performed, for a set of dummy memory cells of a word line. Moreover, a different criterion can be used, and a different read can be performed, for different sets of dummy memory cells of different respective word lines. A decision step 602 determines whether an adjustment of a control gate voltage of the dummy memory cells is indicated. If the decision step is false, there is no change to Vdwll (step 603) and step 605 involves performing another plurality of PE cycles for the set of data memory cells while using the current value of Vdwll.

If decision step 602 is true, step 604 involves adjusting Vdwll. Various examples are provided below. In one approach, Vdwll is increased or decreased to keep the Vth of the dummy memory cells within a desired range (see FIG. 6B). In another approach, Vdwll is increased over time to keep Vdwll-Vth approximately constant (see FIG. 6C). After step 605, step 601 and the following steps can be repeated at a later time when the criterion is met again.

FIG. 6B depicts an example process consistent with FIG. 6A for adjusting the Vth of dummy memory cells to maintain the Vth in a defined range. This process is concerned with the level of Vdwll during an erase operation of the data memory cells. By adjusting this level, a weak erase can be induced for the dummy memory cells when their Vth become higher than a checkpoint voltage. Subsequently, Vdwll can be increased back to the original level or some other level which terminates the weak erase and may allow a gradual increase in Vth. The Vth of the dummy memory cells may therefore repeatedly move higher and lower between upper and lower checkpoint voltages.

Step 610 includes initializing Vdwll to the level for a fresh memory device. Step 611 involves performing a program-erase cycle (e.g., a program operation followed by an erase operation) for a set of data memory cells, and setting Vdwll for the dummy memory cells during erase voltages of the erase operation. For example, see FIGS. 8A and 8B. Step 612 or 616 is then reached. Step 612 is reached if a criterion is not met to evaluate the dummy memory cells. In this case, step 611 is repeated using the same value of Vdwll as in the prior execution of step 611. Step 616 is reached if a criterion is met to evaluate the dummy memory cells. After step 616, step 613 and/or step 617 is reached. Step 613 reads the dummy memory cells at an upper checkpoint voltage (Vucp) to obtain a count of cells with Vth>Vucp. Step 614 reads the dummy memory cells at a lower checkpoint voltage (Vlcp) to obtain a count of cells with Vth<Vucp. In one approach, step 613 is executed after an initial execution of step 616, then step 617 is executed after a second execution of step 616, then step 613 is executed after a third execution of step 616, and so forth in an alternating manner. This is based on the assumption that the Vth of the dummy memory cells will initially be increasing, then decreasing, then increasing and so forth.

Decision step 614 determines if the count from step 613 is above a threshold. For example, the threshold may allow a small portion (e.g., 5-20%) of the dummy memory cells to have a Vth>Vucp without causing a decreasing of Vdwll during subsequent erase voltages in step 615. If decision step 614 is true, the dummy memory cells are out of the optimal Vth range on the high side by an unacceptable amount, and step 615 is reached in which Vdwll is decreased during subsequent erase voltages. In one approach, the amount of the decrease is proportional to the count. For example, see FIG. 9E. If decision step 614 is false, step 620 is reached and there is no change to Vdwll.

Step 621 optionally sets the criterion for a next evaluation of the dummy memory cells. For example, the next evaluation can be relatively sooner if the dummy memory cells are out of the optimal Vth range (step 614 or 618 is true) than if the dummy memory cells are not out of the optimal Vth range (step 614 or 618 is false). The method thus includes determining a next time for evaluating threshold voltages of the dummy memory cells based on whether or not the count exceeds a threshold. For instance, the next time can be relatively sooner when the count exceeds the threshold than when the count does not exceed the threshold based on the assumption that the dummy memory cells should be more closely watched once they have departed from the allowable Vth range. Also, the next time can be relatively sooner when the count is relatively higher.

For instance, a PE increment for the next evaluation may be 3K PE cycles if the dummy memory cells are not out of the optimal Vth range, and a PE increment for the next evaluation may be 2K PE cycles if the dummy memory cells are out of the optimal Vth range. Or, an even sooner evaluation can be made, e.g., at 100 PE cycles or less to ensure that the Vth of the dummy memory cells has move in the desired direction. Moreover, in one option, the urgency for the next evaluation is proportional to the count in step 614 or 618. For example, if under 5%, 5-10% or more than 10% of the dummy memory cells are out of range, the PE increment for the next evaluation may be 3K, 2.5K or 2K PE cycles.

Also, it is possible to set a different criterion for the next evaluation when the dummy memory cells are out of range on the low side versus on the high side. For example, if more than 10% of the dummy memory cells are out of range on the high side, the PE increment for the next evaluation may be changed from 3K to 2K PE cycles, while if more than 10% of the dummy memory cells are out of range on the low side, the PE increment for the next evaluation may be changed from 3K to 2.5K PE cycles. This is based on the idea that the dummy memory cells being out of range on the high side is a more urgent condition.

Decision step 618 determines if the count from step 617 is above a threshold. For example, the threshold may allow a small portion (e.g., 5-20%) of the dummy memory cells to have a Vth<Vlcp without causing an increase in Vdwll during subsequent erase voltages in step 619. If decision step 618 is true, the dummy memory cells are out of the optimal Vth range on the low side by an unacceptable amount, and step 619 is reached in which Vdwll is increased during subsequent erase voltages. In one approach, the amount of the increase is proportional to the count. For example, see FIG. 9F. If decision step 618 is false, step 620 is reached and there is no change to Vdwll.

Note that the threshold can differ in steps 614 and 618. For example, it may be more critical to stop the increase in Vth than the decrease, so that the threshold of step 614 can be lower than in step 618. After Vdwll is increased or decreased, or not changed, a next program-erase cycle occurs at step 611.

FIG. 6C depicts an example process consistent with FIG. 6A for compensating for an increase in the Vth of dummy memory cells. This process is concerned with the level of Vdwll during a programming operation of the data memory cells. By gradually increasing Vdwll over time, an approximately constant value of Vdwll-Vth can be maintained to avoid increasing a channel voltage gradient as Vth gradually increases. Vdwll can be successively increased when the Vth of the dummy memory cells is determined to exceed successively higher upper checkpoint voltages. When Vdwll reaches a maximum allowable level, and the Vth of the dummy memory cells is determined to exceed a final maximum upper checkpoint voltage, the dummy memory cells can be erased and reprogrammed so that the Vth is at a lower, more desirable level.

Another option is to induce a weak erase of the dummy memory cells, as described herein, when Vdwll reaches a maximum allowable level.

Step 630 includes initializing Vdwll to the level for a fresh memory device. Step 631 involves performing a program-erase cycle for a set of data memory cells, and setting Vdwll for dummy memory cells during program voltages of the programming operation. For example, see FIG. 14B. Step 632 or 633 is then reached. Step 632 is reached if a criterion is not met to evaluate the dummy memory cells. In this case, step 631 is repeated using the same value of Vdwll as in the prior execution of step 631. Step 633 is reached if a criterion is met to evaluate the dummy memory cells. Step 634 reads the dummy memory cells at an upper checkpoint voltage (Vucp) to obtain a count of cells with Vth>Vucp.

Decision step 635 determines if the count from step 634 is above a threshold. For example, the threshold may allow a small portion (e.g., 5-20%) of the dummy memory cells to have a Vth>Vucp without causing an increasing of Vdwll in step 639. If decision step 635 is true, a decision step 637 determines if Vdwll is at a maximum allowable level. If decision step 637 is false, step 639 is reached and Vdwll (during subsequent program voltages) and Vucp, are increased. In one approach, the amount of the increase is proportional to the count. For example, see FIG. 12D. If decision step 637 is true, step 638 is reached and the dummy memory cells are erased and reprogrammed, and Vucp is reset to its initial value. The erase and reprogram can occur immediately or at a later time. For example, the erase and reprogram of the dummy memory cells can occur in connection with the next planned erase and program of the data memory cells. If decision step 635 is false, step 636 is reached and there is no change to Vdwll or Vucp. After step 639, step 640 includes setting the criterion for a next evaluation of the dummy memory cells, such as discussed in connection with step 621 of FIG. 6B.

For example, the method can include determining a next time for evaluating threshold voltages of the dummy memory cells based on whether or not the count exceeds a threshold. For instance, the next time can be relatively sooner when the count exceeds the threshold than when the count does not exceed the threshold based on the assumption that the dummy memory cells should be more closely watched once they have departed from the allowable Vth range. Also, the next time can be relatively sooner when the count is relatively higher based on the theory that the Vth is increasing relatively quickly and should be monitored more closely.

Figure 7A:
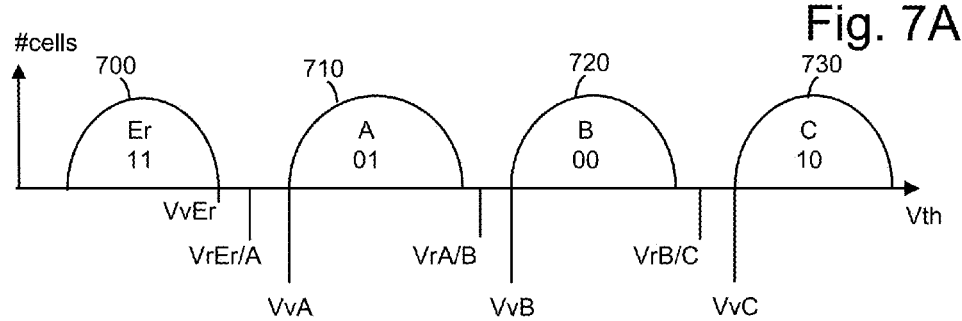
FIG. 7A depicts an example Vth distribution of data memory cells with four data states.

FIG. 7A depicts an example Vth distribution of data memory cells with four data states. Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in a sense block. For example, the LP bit can be stored in LDL and the UP bit can be stored in UDL.

A first Vth distribution 700 is provided for erased (Er) state memory cells. Three Vth distributions 710, 720 and 730 represent target data states A, B and C, respectively, which are reached by memory cells when their Vth exceeds the verify voltage VvA, VvB or VvC, respectively.

A programming operation can use one or more programming pass operation. A one pass programming operation involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in the erased state at the beginning of the programming pass. For example, see FIG. 14A.

After the programming pass is completed, the data can be read from the memory cells using read reference voltages VrEr/A, VrA/B and VrB/C which are between the Vth distributions. At the same time, a read pass voltage, Vread (e.g., 8-9 V), is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Figure 7B:
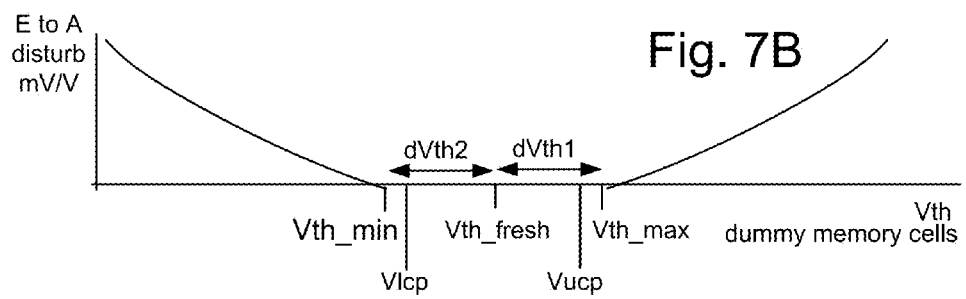
FIG. 7B depicts an amount of disturb for data memory cells in the erased state as a function of a Vth of dummy memory cells, showing a range of allowable Vth values for the dummy memory cells, consistent with the process of FIG. 6B.

FIG. 7B depicts an amount of disturb for data memory cells in the erased state as a function of a Vth of dummy memory cells, showing a range of allowable Vth values for the dummy memory cells, consistent with the process of FIG. 6B. The horizontal axis represents a Vth of dummy memory cells and the vertical axis represents a change in the Vth of E-state data memory cells, in units of mV/V. As mentioned, the data memory cells can be disturbed due to gradients in the channel voltage, where the channel voltage can change due to changes in the Vth of the dummy memory cells. This disturb results in an increase in Vth of the data memory cells. A most likely case is an erased state memory cell being disturbed so that its Vth increases to a level of the A state (an E to A disturb). It has been determined that there is an optimal range of the Vth of the dummy memory cells, between Vth_min and Vth_max, which avoids or minimizes E to A disturbs.

The lower and upper checkpoint voltages, Vlcp and Vucp, respectively, of FIG. 6B can be set based on Vth_min and Vth_max, respectively. In one approach, Vlcp and Vucp are set to Vth_min and Vth_max, respectively. In another approach, as depicted, a margin is provided so that Vlcp>Vth_min and Vucp<Vth_max. Vth_fresh is the median Vth of the dummy memory cells when the memory device is fresh, e.g., when PE=0 or close to 0, or after the dummy memory cells have been reprogrammed, e.g., per step 638 of FIG. 6C. dVth1 is a difference between Vth_max and Vth_fresh, and dVth2 is a difference between Vth_fresh and Vth_min. The results of FIG. 7B can be obtained from test results in which the Vth of the dummy memory cells is intentionally programmed to different levels, or is allowed to gradually increase to different levels over a number of PE cycles. In some cases, dVth1 and dVth2 may differ. Vlcp to Vucp is a desired range to maintain the Vth of the dummy memory cells.

The optimal range of the Vth of the dummy memory cells can be different for dummy memory cells of different word lines. In one approach, the drain-side dummy memory cells which are relatively closer to the drain end of a NAND string have a relatively higher optimal range of Vth (and a higher Vth_fresh) than the drain-side dummy memory cells which are relatively further from the drain end. Similarly, the source-side dummy memory cells which are relatively closer to the source end of a NAND string have relatively higher optimal range of Vth (and a higher Vth_fresh) than the source-side dummy memory cells which are relatively further from the source end.

Figure 7C:
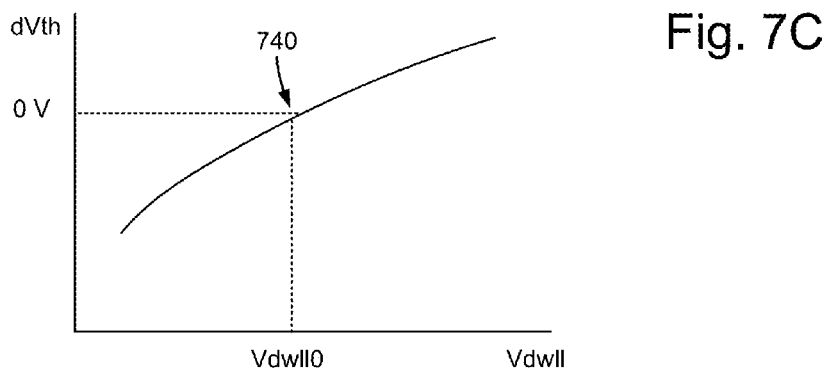
FIG. 7C depicts a change in Vth (dVth) of dummy memory cells during an erase operation for data memory cells as a function of a control gate Vdwll of the dummy memory cells, consistent with the process of FIG. 6B.

FIG. 7C depicts a change in Vth (dVth) of dummy memory cells during an erase operation for data memory cells as a function of a control gate Vdwll of the dummy memory cells, consistent with the process of FIG. 6B. When the data memory cells are erased, a small amount of programming or erasing may occur inadvertently for the dummy memory cells if Vdwll is sufficiently high or low, respectively. When Vdwll is equal to a certain neutral level, Vdwll0, dVth=0 V. When Vdwll>Vdwll0, dVth>0. When Vdwll<Vdwll0, dVth<0. A point 740 corresponds to Vdwll0 and dVth=0 V. This shows that the Vth of the dummy memory cells can be controlled by adjusting Vdwll.

Figure 7D:
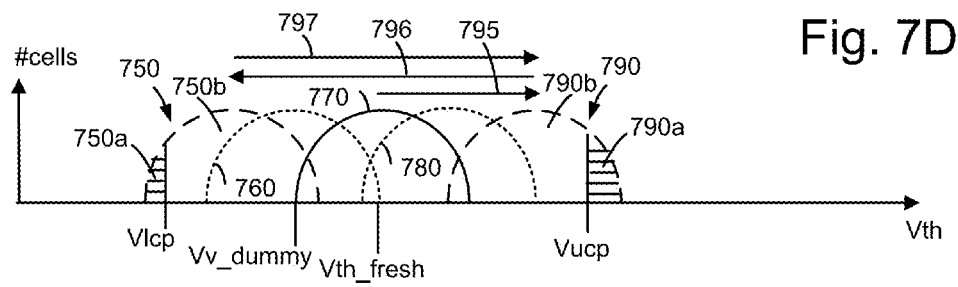
FIG. 7D depicts different Vth distributions for dummy memory cells as the dummy memory cells are alternately gradually programmed and erased, consistent with the process of FIG. 6B.

FIG. 7D depicts different Vth distributions for dummy memory cells as the dummy memory cells are alternately gradually programmed and erased, consistent with the process of FIG. 6B. Initially, the dummy memory cells may be erased as in the Vth distribution 700 in FIG. 7A. The dummy memory cells of a common word line are then programmed to the Vth distribution 770 using a verify voltage of Vv_dummy. Dummy memory cells of different word lines can be programmed to different Vth levels. For example, the Vth may be higher for dummy memory cells (e.g., on DWLL1a and DWLL2a in FIG. 3C1) which are closer to the select gate transistors than for dummy memory cells (e.g., on DWLL1b and DWLL2b in FIG. 3C1) which are further from the select gate transistors. As explained in FIG. 10A, this provides a gradual increase in Vch starting from the drain-end or source-end of the channel of an unselected NAND string.

Over time, the Vth distribution 770 increases to provide the Vth distributions 780 and 790. A criterion is met for evaluating the dummy memory cells at the time of the Vth distribution 790, e.g., as discussed in connection with steps 601, 616 and 633 of FIGS. 6A, 6B and 6C, respectively. The evaluation involves reading the dummy memory cells with Vdwll=Vucp to identify a count of dummy memory cells with Vth>Vucp (region 790a). The remaining dummy memory cells have Vth<Vucp (region 790b). Assuming the count exceeds a threshold, Vdwll is decreased (set at a lower level) in subsequent erase operations of the data memory cells so that the Vth begins to gradually decrease, as represented by Vth distributions 780, 770, 760 and then 750.

A criterion is met for evaluating the dummy memory cells at the time of the Vth distribution 750, e.g., as discussed in connection with steps 601 and 616 of FIGS. 6A and 6B, respectively. The evaluation involves reading the dummy memory cells with Vdwll=Vlcp to identify a count of dummy memory cells with Vth<Vlcp (region 750a). The remaining dummy memory cells have Vth>Vlcp (region 750b). Assuming the count exceeds a threshold, Vdwll is increased in subsequent erase operations of the data memory cells so that the Vth begins to gradually increase, as represented by Vth distributions 760, 770, 780 and then 790. The Vth can repeatedly increase and decrease as represented by arrows 795, 796 and 797.

As mentioned, Vlcp and Vucp can differ for dummy memory cells of different word lines.

Figure 8A:
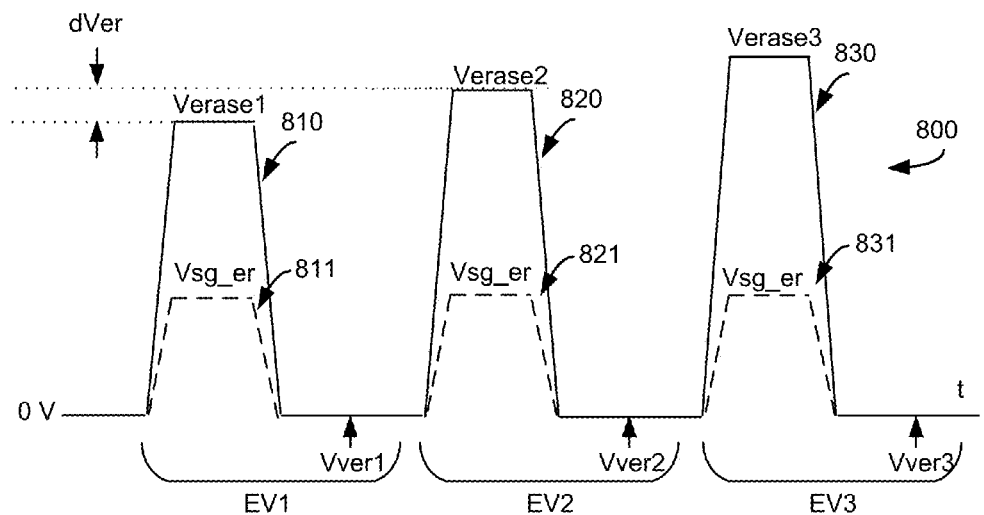
FIG. 8A depicts a waveform of a bit line voltage and a select gate voltage in an example erase operation, consistent with the process of FIG. 6B.
Figure 8B:
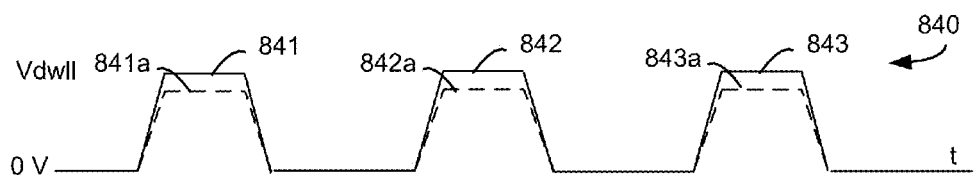
FIG. 8B depicts waveforms of a dummy word line voltage in an example erase operation, consistent with the process of FIG. 6B.
Figure 8C:
FIG. 8C depicts a waveform of a channel voltage in an example erase operation, consistent with the process of FIG. 8A.

The horizontal axes of FIG. 8A to 8C are time-aligned.

FIG. 8A depicts a waveform of a bit line voltage and a select gate voltage in an example erase operation, consistent with the process of FIG. 6B. The vertical axis depicts voltage and the horizontal axis depicts time. The waveform 800 depicts a series of bit line and/or source line voltages 810, 820 and 830 with magnitudes of Verase1, Verase2 and Verase3, respectively, which step up by dVer in each erase-verify iteration. The waveform also depicts select gate voltages 811, 821 and 831 with a common magnitude of Vsg_er, in one approach. In another approach, the select gate voltage also steps up with the bit line and/or source line voltage. The waveform provides a number of erase-verify iterations EV1, EV2 and EV3, each of which is followed by a verify test Vver1, Vver2 or Vver3, respectively. The channel of a NAND string can be charged up in an erase operation based on gate-induced drain leakage (GIDL), which is generated in proportion to the drain-to-gate voltage of the select gate transistors at the drain-end and/or source-end of the NAND sting. In another option, the erase voltage steps up to its peak in two steps instead of one to allow time for the charge up of the channel to occur. In another option, the erase voltage and the select gate voltage both step up to their peaks in two steps.

FIG. 8B depicts waveforms of a dummy word line voltage in an example erase operation, consistent with the process of FIG. 6B. The waveform 840 depicts a series of higher dummy word line voltages 841, 842 and 843 and lower dummy word line voltages 841a, 842a and 843a. This shows how Vdwll can be adjusted during the erase voltages of an erase operation for the data memory cells.

Vdwll during the erase voltages can differ for dummy memory cells of different word lines. In one approach, the drain-side dummy memory cells which are relatively closer to the drain end of a NAND string have a relatively lower Vdwll than the drain-side dummy memory cells which are relatively further from the drain end. Similarly, the source-side dummy memory cells which are relatively closer to the source end of a NAND string have a relatively lower Vdwll than the source-side dummy memory cells which are relatively further from the source end.

FIG. 8C depicts a waveform of a channel voltage (Vch) in an example erase operation, consistent with the process of FIG. 8A. The waveform 860 depicts peaks 861, 862 and 863 in Vch which occur as the channel is charged up with each erase voltage of FIG. 8A. Note that it takes some time for Vch to reach its peak level after Verase and Vdwll are stepped up. As a result, there will be a relatively high gate-to-channel voltage across the dummy memory cells at the start of each erase voltage which can induce weak programming. When Vch reaches its peak, the gate-to-channel voltage across the dummy memory cells becomes lower. A weak erase of the dummy memory cells can be induced if the gate-to-channel voltage is sufficiently low.

FIG. 9A depicts an example time line showing when a criterion is met for evaluating dummy memory cells as a function of a number of program-erase (PE) cycles, consistent with steps 601, 616 and 633 of FIGS. 6A, 6B and 6C, respectively. In one approach, the criterion is met when a specified number of PE cycles have elapsed since a last time the criterion was met. For example, the PE cycles may be evenly spaced, e.g., at 3K, 6K and 9K PE cycles (increment of 3K), spaced at progressively shorter increments, e.g., 5K, 8K and 10K PE cycles (increments of 5K, 3K and 2K), or spaced at progressively larger increments, e.g., 2K, 5K and 10K (increments of 2K, 3K and 5K). The three cases are represented by solid line squares, dotted line squares and triangles, respectively.

FIG. 9B depicts an example time line showing when a criterion is met for evaluating dummy memory cells as a function of a number of read operations, consistent with steps 601, 616 and 633 of FIGS. 6A, 6B and 6C, respectively. A read operation can include a read process in which the data states of a set of data memory cells is determined. For a four-state memory device, this process may involve applying three demarcation voltages on a word line. In one approach, the criterion is met when a specified number of read operations (or cycles) have elapsed since a last time the criterion was met. For example, the read operations may be evenly spaced, spaced at progressively shorter increments, or spaced at progressively larger increments. The three cases are represented by solid line squares, dotted line squares and triangles, respectively.

FIG. 9C depicts an example time line showing when a criterion is met for evaluating dummy memory cells as a function of a metric which is based on a number of PE cycles and a number of read operations, consistent with steps 601, 616 and 633 of FIGS. 6A, 6B and 6C, respectively. As discussed, both read operations and PE cycles can affect the Vth of dummy memory cells. Accordingly, a criterion can be met according to a metric which is based on both factors. Moreover, the factors can be weighted differently according to their respective effects on Vth, e.g., as determined by testing.

FIG. 9D depicts an example of a dummy word line voltage during an erase pulse as a function of a number of PE cycles, consistent with the process of FIG. 6B. Vdwll is initially at Vdwll_fresh, from 0-5K. At 5K, an evaluation determines that the Vth has exceeded Vucp, so that Vdwll should be decreased by $\Delta V2\_1b$ and Vdwll=Vdwll−$\Delta V2\_1b$ from 5K-8K. At 8K, an evaluation determines that the Vth has fallen below Vlcp, so that Vdwll should be increased back to Vdwll_fresh and Vdwll=Vdwll_fresh 8K-10K. Or, Vdwll can be increased to a level which is above or below Vdwll_fresh. At 10K, an evaluation determines that the Vth has again exceeded Vucp, so that Vdwll should be decreased by $\Delta V3\_1b$ and Vdwll=Vdwll−$\Delta V3\_1b$ from 10K-12K. At 12K, an evaluation determines that the Vth has again fallen below Vlcp, so that Vdwll should be increased by $\Delta V4\_1b$ and Vdwll=Vdwll+$\Delta V4\_1b$ from 12K-14K. In this example, the adjustment to Vdwll is a function of the count, as discussed previously. At 14K, an evaluation determines that the Vth has again exceeded Vucp, so that Vdwll should be decreased, this time to Vdwll_fresh from 12K-14K. See FIG. 9G.

Optionally, based on the evaluation at 5K, Vdwll can decrease by $\Delta V1\_1b$, so that Vdwll=Vdwll−$\Delta V1\_1b$ from 5K-6K and then by $\Delta V2\_1b$, so that Vdwll=Vdwll−$\Delta V2\_1b$ from 6K-8K. This provides a stronger initial erase of the dummy memory cells so that their Vth moves back below Vucp more quickly. See FIG. 9H. Other variations are possible as well.

FIG. 9E depicts an example of a dummy word line voltage during an erase voltage which is inversely proportional to a count of a number of dummy memory cells having Vth>Vucp, an upper check point voltage, consistent with the process of FIG. 6B. This approach counteracts an increase in the Vth in proportion to the degree of increase. When a relatively large number of dummy memory cells have Vth>Vucp, a relatively smaller Vdwll is provided so that a relatively stronger erase is provided in subsequent PE cycles.

FIG. 9F depicts an example of a dummy word line voltage during an erase voltage which is proportional to a count of a number of dummy memory cells having Vth<Vlcp, a lower check point voltage, consistent with the process of FIG. 6B. This approach counteracts a decrease in the Vth in proportion to the degree of decrease. When a relatively large number of dummy memory cells have Vth<Vlcp, a relatively larger Vdwll is provided so that a relatively stronger programming is provided in subsequent PE cycles.

FIG. 9G depicts an example sequence of program-erase cycles in which programming of dummy memory cells (PE cycles 1501 and 1503) alternates with erasing (PE cycles 1502 and 1504), consistent with FIG. 9D. For example, referring to FIG. 9D, Vdwll_fresh can be a first control gate voltage over a first plurality of PE cycles 0-5K, Vdwll=Vdwll−$\Delta V2\_1b$ can be a second control gate voltage over a second plurality of PE cycles 5-8K, Vdwll_fresh can be a third control gate voltage over a third plurality of PE cycles 8-10K and Vdwll=Vdwll−$\Delta V3\_1b$ can be a fourth control gate voltage over a fourth plurality of PE cycles 10-12K.

FIG. 9H depicts an example sequence of program-erase cycles comprising programming of dummy memory cells (PE cycles 1511), strong erasing (PE cycles 1512), weak erasing (PE cycles 1513) and programming (PE cycles 1514), consistent with FIG. 9D. For example, referring to FIG. 9D, Vdwll_fresh can be a first control gate voltage over a first plurality of PE cycles 0-5K, Vdwll=Vdwll−$\Delta V1\_1b$ can be a second control gate voltage over a second plurality of PE cycles 5-6K, Vdwll=Vdwll−$\Delta V2\_1b$ can be a third control gate voltage over a third plurality of PE cycles 6-8K, and Vdwll_fresh can be a fourth control gate voltage over a fourth plurality of PE cycles 8-10K.

FIG. 9I depicts an example sequence of program-erase cycles comprising programming of dummy memory cells (PE cycles 1521), erasing (PE cycles 1522), strong programming (PE cycles 1523) and weak programming (PE cycles 1524), consistent with FIG. 9D. For example, referring to FIG. 9D, Vdwll_fresh can be a first control gate voltage over a first plurality of PE cycles 8-10K, Vdwll=Vdwll−$\Delta V3\_1b$ can be a second control gate voltage over a second plurality of PE cycles 10-12K, Vdwll=Vdwll+$\Delta V4\_1b$ can be a third control gate voltage over a third plurality of PE cycles 12-14K, and Vdwll_fresh can be a fourth control gate voltage over a fourth plurality of PE cycles 14-16.

FIG. 10A depicts a circuit diagram of a selected NAND string (NS_sel) and an unselected NAND string (NS_un), consistent with the memory devices of FIGS. 2C and 3C1. The word lines for data memory cells are WLL0-WLL21. WLL0-WLL21 are connected to data memory cells 1027-1005, respectively, in NS_sel and to data memory cells 1067-1045, respectively, in NS_un. Dummy word lines DWLL1a, DWLL1b, DWLL2b and DWLL2a are connected to dummy memory cells 1003, 1004, 1028 and 1029, respectively, in NS_sel and to dummy memory cells 1043, 1044, 1068 and 1069, respectively, in NS_un. The word lines are connected to both the selected and unselected NAND strings. Two SGD lines, SGD1_sel and SGD2_sel, are connected to the SGD transistors 1001 and 1002, respectively, in the selected NAND strings and, optionally, to one another. Two SGS lines, SGS1_sel and SGS2_sel are connected to the SGS transistors 1031 and 1030, respectively, in the selected NAND strings and, optionally, to one another. Two SGD lines, SGD1_un and SGD2_un are connected to the SGD transistors 1041 and 1042, respectively, in the unselected NAND strings and, optionally, to one another. Two SGS lines, SGS1_un and SGS2_un are connected to the SGS transistors 1071 and 1070, respectively, in the unselected NAND strings and, optionally, to one another.

I_NS_sel is a current in NS_sel. The current is sensed by sensing circuitry 1000 via a bit line 1080 which is at a voltage, Vbl. A channel of NS_sel is ch_sel and has a voltage of Vch_sel. A channel of NS_un is ch_un and has a voltage of Vch_un (also referred to as Vch).

A common bit line 1080 connects the drain end of the NAND strings to the sensing circuitry, which is used to sense NS_sel during a sensing operation. A source line 1081 is connected to source ends of the NAND strings. Voltage drivers can be used to provide voltages on the control lines (e.g., word lines, select gate lines, bit line and source line).

A plot 1099 depicts channel voltages in different portions of the channel ch_un. For example, at the drain end (DE) of NS_un, channel portions 1041ch, 1042ch, 1043ch, 1044ch, 1045ch and 1046ch are associated with SGD transistors 1041 and 1042, dummy memory cells 1043 and 1044, and data memory cells 1045 and 1046, respectively. At the source end (SE) of NS_un, channel portions 1071ch, 1070ch, 1069ch, 1068ch, 1067ch and 1066ch are associated with SGS transistors 1071 and 1070, dummy memory cells 1069 and 1068, and data memory cells 1067 and 1066, respectively.

In an example, during a programming operation involving NS_sel, the channel portions 1041ch and 1042ch may be at about 0 V, based on Vbl=0 V and Vsgd1_un and Vsgd2_un=0 V. The channel portion 1043ch may be at 4 V based on Vdwll1a=5 V and Vth=1 V. The channel portion 1044ch may be at 8 V based on Vdwll1b=7 V and Vth=−1 V. The channel portions 1045ch and 1046ch (and the channel portions between 1046ch and 1066ch) may be at about 12 V on average. In practice, the selected word line has a higher voltage, e.g., 15-25 V than the unselected word lines, e.g., at 8-9 V. This can create a large gradient in the channel portion of the selected word line which causes electron-hole generation. The electrons go into a potential well under the selected word line and tend to pull down the Vch toward the average. However, this takes some time compared to the duration of the program voltage, so that the Vch of the channel portion of the selected word line can still be higher than the average.

The changes in voltage of the different channel portions on the drain-side of the NAND string are dV1=4 V, dV2=4 V and dV3=4 V. A relatively gradual increase in Vch is therefore provided to avoid or minimize electron-hole generation in this area of the channel which can cause disturbs on the data memory cell 1045, in particular. A change in the Vth of a dummy memory cell can increase the channel gradient. For example, if the Vth of the dummy memory cell 1043 increases by 1 V, the voltage for the channel portion 1043ch will decrease by 1 V, e.g., to 3 V. In this case, dV2 increases from 4 V (8-4) to 5 V (8-3).

The situation at the source side of NS_un is less problematic since the channel portions 1071ch and 1070ch are at 2 V, for instance, rather than 0 V, based on Vsl=2 V and Vsgs1_un and Vsgs2_un=2 V. The channel portion 1069ch may be at 5.3 V based on Vdwll2a=6.3 V and Vth=1 V. The channel portion 1068ch may be at 8.6 V based on Vdwll1b=7.6 V and Vth=−1 V. The channel portions 1067ch and 1066ch may be at about 12 V on average, as discussed.

One or more dummy memory cells can be provided at the drain-end and/or source-end of a NAND string.

Figure 10B:
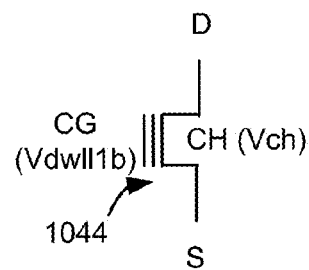
FIG. 10B depicts the example dummy memory cell 1044 of FIG. 10A.

FIG. 10B depicts the example dummy memory cell 1044 of FIG. 10A. It includes a control gate CG at a voltage of Vdwll1b, a drain (D) and a source (S).

Figure 11:
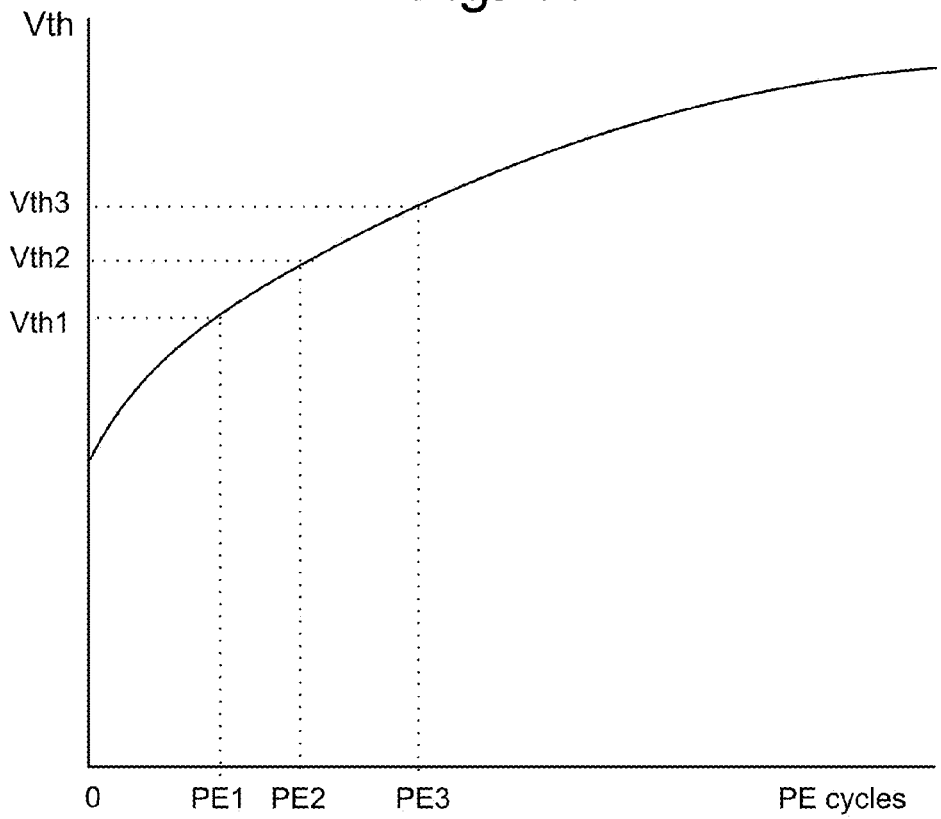
FIG. 11 depicts an increase in the Vth of dummy memory cells as a function of PE cycles, consistent with the process of FIG. 6C.

FIG. 11 depicts an increase in the Vth of dummy memory cells as a function of PE cycles, consistent with the process of FIG. 6C. As mentioned, the Vth can increase gradually over time as PE cycles and read operations are performed. Tests have shown that the rate of increase can be faster at first and then slower. This information can be used to optimally set times for evaluating the dummy memory cells. This reduces processing requirements while still adjusting the control gate voltage sufficiently often to avoid large changes, and the corresponding likelihood of disturbs, in the channel voltage under the dummy memory cells.

The Vth has values of Vth1, Vth2 and Vth3 at PE1, PE2 and PE3, respectively. An increment between PE1 and PE2 is smaller than an increment between PE2 and PE3, while Vth2-Vth1 and Vth3-Vth2 are equal. This approach sets the times in which the criterion is met for evaluating the dummy memory cells when the Vth has increased by roughly equal amounts. The times are set according to progressively large increments in PE. In another approach, the times can be set according to equal increments in PE, in which case the increases in Vth will be progressively smaller.

FIG. 12A depicts an initial Vth distribution 1200 and a subsequent Vth distribution 1210 of dummy memory cells, and a first upper checkpoint voltage Vucp1, consistent with the process of FIG. 6C. The evaluation involves reading the dummy memory cells with Vdwll=Vucp1 to identify a count of dummy memory cells with Vth>Vucp1 (region 1210a). The remaining dummy memory cells have Vth<Vucp1 (region 1210b). Vucp1 may be used for a fresh memory device, for example. Assuming the count exceeds a threshold, Vdwll is set to an increased level in subsequent programming operations of the data memory cells.

FIG. 12B depicts the subsequent Vth distribution 1210 and a further Vth distribution 1220 of dummy memory cells, and a second upper checkpoint voltage Vucp2, consistent with the process of FIG. 6C. The evaluation involves reading the dummy memory cells with Vdwll=Vucp2 to identify a count of dummy memory cells with Vth>Vucp2 (region 1220a). The remaining dummy memory cells have Vth<Vucp2 (region 1220b). Assuming the count exceeds a threshold, Vdwll is increased in subsequent programming operations of the data memory cells. Vucp1 may be the second value of Vucp which is used.

FIG. 12C depicts a plot of an upper checkpoint voltage Vucp as a function of PE cycles, consistent with the process of FIG. 6C. Consistent with FIG. 11, Vucp can increase relatively quickly at first and then more slowly with the number of PE cycles to correspond to the expected rates of increase in the Vth of the dummy memory cells.

FIG. 12D depicts a plot of Vdwll which is a function of a count of dummy memory cells with Vth>Vucp, and a function of Vucp, consistent with the process of FIG. 6C. The arrow represents larger values of Vucp. Vdwll during a program voltage can be relatively higher when the count of cells which exceed the ith checkpoint is relatively higher. This ensures that Vdwll is optimal for a majority of the dummy memory cells. For example, plots 1250 and 1251 show ranges of values for Vdwll for lower and higher values of Vucp, respectively.

FIG. 13A depicts a plot of Vucp as a function of PE cycles, where the PE cycles in which the dummy memory cells are evaluated are equally spaced and Vucp increases by progressively smaller steps. The PE cycles at the evaluation times are 5K, 10K and 15K. Vucp is set to Vucp1 from 0-5K, Vucp2 from 5K-10K and Vucp3 from 10K-15K. The steps in Vucp are $\Delta V1\_cp$ at 5K and a smaller step of $\Delta V2\_cp$ at 10K.

FIG. 13B depicts a plot of Vucp as a function of PE cycles, where the PE cycles in which the dummy memory cells are evaluated are spaced by progressively larger amounts and Vucp increases by equal steps. The PE cycles at the evaluation times are 5K, 12K and 15K. Vucp is set to Vucp1 from 0-5K, Vucp2 from 5K-12K and Vucp3a from 12K-15K. The steps in Vucp are $\Delta V1\_cp$ at 5K and 12K.

FIG. 13C depicts a plot of Vdwll as a function of PE cycles, consistent with FIG. 13A, where PE cycles in which the dummy memory cells are evaluated are equally spaced and Vdwll increases by progressively smaller steps. The PE cycles at the evaluation times are 5K, 10K and 15K. Vdwll is set to Vdwll1=Vdwll_fresh from 0-5K, Vdwll2 from 5K-10K and Vdwll3 from 10K-15K. The steps in Vdwll are $\Delta V1\_1b$ at 5K and a smaller step of $\Delta V2\_1b$ at 10K.

FIG. 13D depicts a plot of Vdwll as a function of PE cycles, consistent with FIG. 13B, where the PE cycles in which the dummy memory cells are evaluated are spaced by progressively larger amounts and Vdwll increases by equal steps. The PE cycles at the checkpoints are 5K, 12K and 15K. Vdwll is set to Vdwll(0) (Vdwll_fresh) from 0-5K, Vdwll2 from 5K-12K and Vdwll3a from 12K-15K. The steps in Vdwll are $\Delta V1\_1b$ at 5K and 12K.

FIG. 13E depicts an example sequence of program-erase cycles in Vdwll is set at Vdwll_fresh (PE cycles 1531), Vdwll2 (PE cycles 1532) and Vdwll2 (PE cycles 1533), consistent with FIG. 13C. For example, referring to FIG. 13C, Vdwll_fresh can be a first control gate voltage over a first plurality of PE cycles 0-5K, Vdwll2 can be a second control gate voltage over a second plurality of PE cycles 5-10K, and Vdwll3 can be a third control gate voltage over a third plurality of PE cycles 10-15K.

In another approach, Vdwll_fresh can be a first control gate voltage in at least one initial program-erase cycle for the data memory cells, Vdwll2 can be a second control gate voltage in at least one additional program-erase cycle which is after the at least one initial program-erase cycle, and Vdwll3 can be a third control gate voltage in at least one further program-erase cycle which is after the at least one additional program-erase cycle.

Figure 14A:
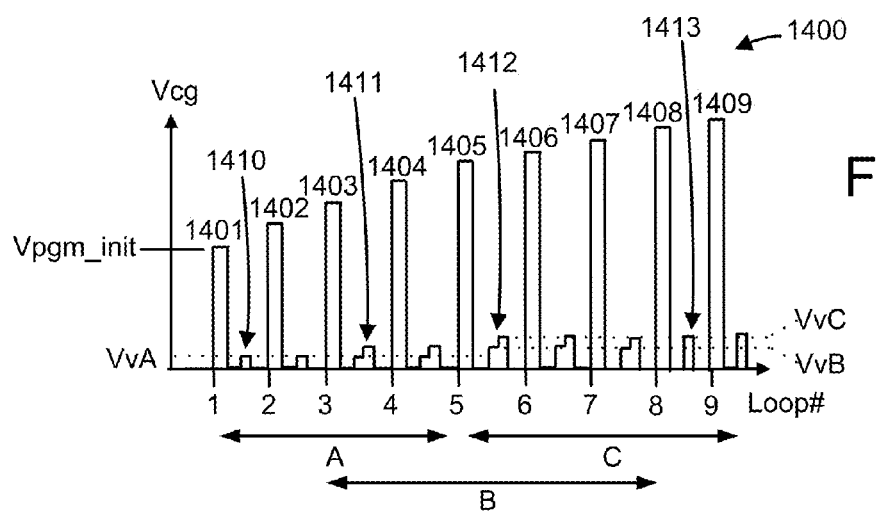
FIG. 14A depicts voltages applied to a word line for data memory cells in an example programming operation consistent with the PE cycles of FIG. 6A-6C.

FIG. 14A depicts voltages applied to a word line for data memory cells in an example programming operation consistent with the PE cycles of FIG. 6A-6C. A one pass programming operation with four data states is depicted. Other options are possible. The programming operation comprises a series of waveforms 1400. Incremental step pulse programming is performed for each target data state. This example also performs verify tests based on the program loop. For example, the A, B and C state cells are verified in loops 1-4, 3-7 and 5-9, respectively. An example verify waveform 1410 comprises an A state verify voltage at VvA. An example verify waveform 1411 comprises A and B state verify voltages at VvA and VvB, respectively. An example verify waveform 1413 comprises B and C state verify voltages at VvB and VvC, respectively. An example verify waveform 1414 comprises a C state verify voltage at VvC. The program voltages (pulses) 1401-1409 are also depicted. An initial program pulse has the magnitude of Vpgm_init. A program pulse is a waveform that increases from an initial value, e.g., 0 V, to a peak value, in one or more steps, and then back to the initial value, typically.

Figure 14B:
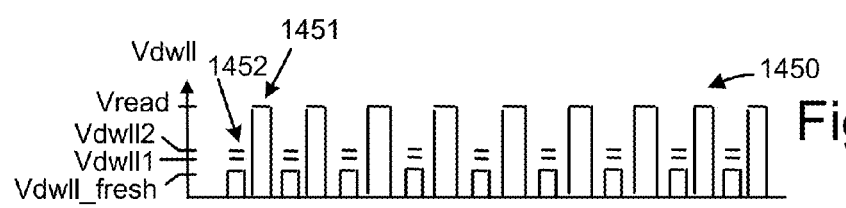
FIG. 14B depicts Vdwll in the example programming operation of FIG. 14A, consistent with FIG. 13C.

FIG. 14B depicts Vdwll in the example programming operation of FIG. 14A, consistent with FIG. 13C. FIG. 14B is time-aligned with FIG. 14B. During the program voltages, Vdwll is set at an optimal level which maintains a substantially fixed gate-to-channel voltage. This is achieved by gradually raising Vdwll over time as Vth gradually increases. For example, Vdwll has an initial level of Vdwll_fresh which is increased to Vdwll2 and then to Vdwll3. One of these levels is used for a given programming operation. Additional increases can be provided as well. A voltage 1452 is an example of Vdwll during a program voltage. During the verify voltages of FIG. 14A, Vdwll can be set to a pass voltage (Vread) which provides the dummy memory cells in a conductive state to allow sensing of the data memory cells. A voltage 1451 is an example of Vdwll during a verify voltage.

The levels of Vdwll during the program voltages can differ for dummy memory cells of different word lines. In one approach, the drain-side dummy memory cells which are relatively closer to the drain end of a NAND string have relatively lower Vdwll than the drain-side dummy memory cells which are relatively further from the drain end. Similarly, the source-side dummy memory cells which are relatively closer to the source end of a NAND string have relatively lower Vdwll than the source-side dummy memory cells which are relatively further from the source end.

Accordingly, it can be seen that, in one embodiment, a method for operating a memory device (100) comprises: performing a first plurality of program-erase cycles (1501, 1511, 1521) involving a set of data memory cells (1005-1027, 1045-1067), the set of data memory cells is eligible to store data, the set of data memory cells is in a plurality of NAND strings (NS_sel, NS_unsel, NS0, ..., NS0-14, NS0A, NS0A-14), each NAND string of the plurality of NAND string comprising a first dummy memory cell (1003, 1004, 1028, 1029, 1043, 1044, 1068, 1069) which is a non-data-storing memory cell and is provided between memory cells of the set which are in the NAND string and a select gate transistor (1001, 1002, 1030, 1031, 1041, 1042, 1070, 1071) of the NAND string, wherein each program-erase cycle of the first plurality of program-erase cycles comprises a program operation and an erase operation; setting a first control gate voltage (Vdwll, Vdwll_fresh) for the first dummy memory cells during erase operations of the first plurality of program-erase cycles; after the first plurality of program-erase cycles, performing a first evaluation of threshold voltages of the first dummy memory cells, the performing the first evaluation comprises determining a first count of the first dummy memory cells which have a threshold voltage above an upper checkpoint voltage (Vucp) and determining whether or not the first count exceeds a threshold; and if the first count exceeds the threshold, setting a second control gate voltage (Vdwll-$\Delta V1\_1b$, Vdwll-$\Delta V2\_1b$), lower than the first control gate voltage, for the first dummy memory cells during erase operations of a second plurality of program-erase cycles (1502, 1512, 1513, 1522) which are after the first plurality of program-erase cycles.

In another embodiment, a 3D stacked non-volatile-memory device comprises: a control gate layer (DWLL1a, DWLL1b, DWLL2b, DWLL2a) connected to first dummy memory cells (1003, 1004, 1028, 1029, 1043, 1044, 1068, 1069) which are non-data-storing memory cells; a control gate layer (SGD1_sel, SGD2_sel, SGD1_un, SGD2_un) connected to select gate transistors (1001, 1002, 1041, 1042); control gate layers (WLL0-WLL22) connected to data memory cells (1005-1027, 1045-1067), wherein the data memory cells are eligible to store data and the dummy memory cells are between the select gate transistors and the data memory cells, in a plurality of NAND strings (NS_sel, NS_unsel, NS0, ..., NS0-14, NS0A, ..., NS0A-14); and a control circuit (110, 112, 114, 116, 122, 128, 132, SB1, SB2, ..., SBp). The control circuit is configured to: perform at least one initial program-erase cycle (1501, 1511, 1521) for the data memory cells, wherein each program-erase cycle of the at least one first program-erase cycle comprises a program operation and an erase operation; set a first control gate voltage (Vdwll, Vdwll_fresh) for the first dummy memory cells during the erase operation of each program-erase cycle of the at least one initial program-erase cycle; after the at least one initial program-erase cycle, determine a first count of the first dummy memory cells which have a threshold voltage above an upper checkpoint voltage (Vucp); and if the first count exceeds a threshold, set a second control gate voltage (Vdwll-$\Delta$V1_1b, Vdwll-$\Delta$V2_1b), lower than the first control gate voltage, for the first dummy memory cells during an erase operation of at least one additional program-erase cycle (1502, 1512, 1513, 1522) which is after the at least one initial program-erase cycle.

In another embodiment, a memory controller (122) comprises: a storage device (122a, 122b, 126a) comprising a set of instructions (160) and a processor (122c) operable to execute the set of instructions. The set of instructions comprises: instructions for erasing one or more memory cells in a set of data memory cells (161), the set of data memory cells is eligible to store data and is in a plurality of NAND strings, each NAND string of the plurality of NAND string comprising a first dummy memory cell which is a non-data-storing memory cell and is provided between memory cells of the set which are in the NAND string and a select gate transistor of the NAND string; instructions for setting a first control gate voltage for the first dummy memory cells during the erasing of the one or more memory cells in the set of data memory cells (162); instructions for performing read operations involving the set of data memory cells, including applying at least one demarcation voltage to selected memory cells in the set while applying a pass voltage to unselected memory cells in the set (163); instructions for determining a first count of the first dummy memory cells which have a threshold voltage above an upper checkpoint voltage, after the erasing of the one or more memory cells in the set of data memory cells and the read operations (164); and instructions for setting a second control gate voltage, lower than the first control gate voltage, for the first dummy memory cells during a subsequent erase operation involving one or more memory cells in the set of data memory cells, if the first count exceeds a threshold (165).

In another embodiment, a memory device comprises: a plurality of NAND strings (NS_sel, NS_unsel, NS0, . . . , NS0-14, NS0A, . . . , NS0A-14) comprising a set of data memory cells (1005-1027, 1045-1067), the set of data memory cells is eligible to store data, each NAND string of the plurality of NAND string comprising a first dummy memory cell (1003, 1004, 1028, 1029, 1043, 1044, 1068, 1069) which is a non-data-storing memory cell and is provided between memory cells of the set which are in the NAND string and a select gate transistor (1001, 1002, 1030, 1031, 1041, 1042, 1070, 1071) of the NAND string; and a control circuit (110, 112, 114, 116, 122, 128, 132, SB1, SB2, . . . , SBp). The control circuit is configured to: perform a first plurality of program-erase cycles (1501, 1511, 1521) involving the set of data memory cells, wherein each program-erase cycle of the first plurality of program-erase cycles comprises a program operation and an erase operation; set a first control gate voltage (Vdwll, Vdwll_fresh) for the first dummy memory cells during erase operations of the first plurality of program-erase cycles; after the first plurality of program-erase cycles, perform a first evaluation of threshold voltages of the first dummy memory cell, the control circuit, to perform the first evaluation, is configured to determine a first count of the first dummy memory cells which have a threshold voltage above an upper checkpoint voltage (Vucp); and if the first count exceeds a threshold, set a second control gate voltage (Vdwll-$\Delta$V1_1b, Vdwll-$\Delta$V2_1b), lower than the first control gate voltage, for the first dummy memory cells during erase operations of a second plurality of program-erase cycles (1502, 1512, 1513, 1522) which are after the first plurality of program-erase cycles.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
performing a first plurality of program-erase cycles involving a set of data memory cells, the set of data memory cells is eligible to store data, the set of data memory cells is in a plurality of NAND strings, each NAND string of the plurality of NAND string comprising a first dummy memory cell which is a non-data-storing memory cell and is provided between memory cells of the set which are in the NAND string and a select gate transistor of the NAND string, wherein each program-erase cycle of the first plurality of program-erase cycles comprises a program operation and an erase operation;
setting a first control gate voltage for the first dummy memory cells during erase operations of the first plurality of program-erase cycles;
after the first plurality of program-erase cycles, performing a first evaluation of threshold voltages of the first dummy memory cells, the performing the first evaluation comprises determining a first count of the first dummy memory cells which have a threshold voltage above an upper checkpoint voltage and determining whether or not the first count exceeds a threshold; and
if the first count exceeds the threshold, setting a second control gate voltage, lower than the first control gate voltage, for the first dummy memory cells during erase operations of a second plurality of program-erase cycles which are after the first plurality of program-erase cycles.

2. The method of claim 1, further comprising:
determining a next time for performing a second evaluation of the threshold voltages of the first dummy memory cell based on whether or not the first count exceeds the threshold, wherein the next time is relatively sooner when the first count exceeds the threshold than when the first count does not exceed the threshold.

3. The method of claim 2, wherein:
the next time for performing the second evaluation is set based on the first count.

4. The method of claim 1, wherein:
the first plurality of program-erase cycles cause a gradual programming of the first dummy memory cells; and
the second plurality of program-erase cycles cause a gradual erase of the first dummy memory cells.

5. The method of claim 1, further comprising:
if the first count does not exceed the threshold, setting the first control gate voltage for the first dummy memory cells during the erase operations of the second plurality of program-erase cycles.

6. The method of claim 1, wherein:
the second control gate voltage is inversely proportional to the first count.

7. The method of claim 1, further comprising:
if the first count exceeds the threshold, setting a third control gate voltage, higher than the second control gate voltage and lower than the first control gate voltage, for the first dummy memory cells during erase operations of a third plurality of program-erase cycles which are after the second plurality of program-erase cycles.

8. The method of claim 1, further comprising:
after the first plurality of program-erase cycles, determining a second count of the first dummy memory cells which have a threshold voltage above the upper checkpoint voltage; and
setting a third control gate voltage for the first dummy memory cells during erase operations of a third plurality of program-erase cycles which are after the second plurality of program-erase cycles, wherein the third control gate voltage is inversely proportional to the second count.

9. The method of claim 1, further comprising:
tracking a number of read operations experienced by the set of data memory cells, wherein the first evaluation is triggered based on the number of read operations.

10. The method of claim 1, wherein:
tracking a number of program-erase cycles experienced by the set of data memory cells, wherein the first evaluation is triggered based on the number of program-erase cycles.

11. The method of claim 1, further comprising:
after the second plurality of program-erase cycles, determining a second count of the first dummy memory cells which have a threshold voltage below a lower checkpoint voltage; and
if the second count exceeds a threshold, setting a third control gate voltage, higher than the second control gate voltage, for the first dummy memory cells during erase operations of a third plurality of program-erase cycles, after the second plurality of program-erase cycles.

12. The method of claim 11, wherein:
the third control gate voltage is inversely proportional to the first count.

13. The method of claim 11, wherein:
the first plurality of program-erase cycles cause a gradual programming of the first dummy memory cells;
the second plurality of program-erase cycles cause a gradual erase of the first dummy memory cells; and
the third plurality of program-erase cycles cause a gradual programming of the first dummy memory cells.

14. The method of claim 1, wherein:
during the erase operations of the first plurality of program-erase cycles, the first control gate voltage is set for the first dummy memory cells while an erase voltage is applied to an end of each NAND string to charge up a channel of each NAND string; and
during the erase operations of the second plurality of program-erase cycles, the second control gate voltage is set for the first dummy memory cells while an erase voltage is applied to the end of each NAND string to charge up the channel of each NAND string.

15. The method of claim 1, wherein each NAND string of the plurality of NAND string comprises a second dummy memory cell which is a non-data-storing memory cell and is provided between the first dummy memory cells of the NAND string and the select gate transistor of the NAND string, the method further comprising:
setting a first control gate voltage for the second dummy memory cells during the erase operations of the first plurality of program-erase cycles;
after the first plurality of program-erase cycles, determining a count of the second dummy memory cells which have a threshold voltage above an upper checkpoint voltage; and
if the count of the second dummy memory cells exceeds a threshold, setting a second control gate voltage for the second dummy memory cells during the erase operations of the second plurality of program-erase cycles, wherein the second control gate voltage for the second dummy memory cells is lower than the first control gate for the second dummy memory cells.

16. The method of claim 15, wherein:
the first control gate voltage for the second dummy memory cells is different than the first control gate voltage for the first dummy memory cells;
the second control gate voltage for the first dummy memory cells is different than the second control gate voltage for the second dummy memory cells; and
the upper checkpoint voltage for the second dummy memory cells is different than the upper checkpoint voltage for the first dummy memory cells.

17. A 3D stacked non-volatile-memory device, comprising:
a control gate layer connected to first dummy memory cells which are non-data-storing memory cells;
a control gate layer connected to select gate transistors;
control gate layers connected to data memory cells, wherein the data memory cells are eligible to store data and the dummy memory cells are between the select gate transistors and the data memory cells, in a plurality of NAND strings; and
a control circuit, the control circuit is configured to:
perform at least one initial program-erase cycle for the data memory cells, wherein each program-erase cycle of the at least one first program-erase cycle comprises a program operation and an erase operation;
set a first control gate voltage for the first dummy memory cells during the erase operation of each program-erase cycle of the at least one initial program-erase cycle;
after the at least one initial program-erase cycle, determine a first count of the first dummy memory cells which have a threshold voltage above an upper checkpoint voltage; and
if the first count exceeds a threshold, set a second control gate voltage, lower than the first control gate voltage, for the first dummy memory cells during an erase operation of at least one additional program-erase cycle which is after the at least one initial program-erase cycle.

18. The 3D stacked non-volatile-memory device of claim 17, wherein:
the second control gate voltage is inversely proportional to the first count.

19. The 3D stacked non-volatile-memory device of claim 17, wherein:
if the first count exceeds the threshold, the control circuit is configured to set a third control gate voltage, higher than the second control gate voltage and lower than the first control gate voltage, for the first dummy memory cells during an erase operation of at least one further program-erase cycle which is after the at least one additional program-erase cycle.

20. The 3D stacked non-volatile-memory device of claim 17, wherein:
after the at least one additional program-erase cycle, the control circuit is configured to determine a count of the first dummy memory cells which have a threshold voltage below a lower checkpoint voltage; and if the count of the first dummy memory cells which have the threshold voltage below the lower checkpoint voltage exceeds a threshold, set a third control gate voltage, higher than the second control gate voltage, for the first dummy memory cells during an erase operation of at least one further program-erase cycle which is after the at least one additional program-erase cycle.

21. A memory controller, comprising:

a storage device comprising a set of instructions, the set of instructions comprising:

instructions for erasing one or more memory cells in a set of data memory cells, the set of data memory cells is eligible to store data and is in a plurality of NAND strings, each NAND string of the plurality of NAND string comprising a first dummy memory cell which is a non-data-storing memory cell and is provided between memory cells of the set which are in the NAND string and a select gate transistor of the NAND string;

instructions for setting a first control gate voltage for the first dummy memory cells during the erasing of the one or more memory cells in the set of data memory cells;

instructions for performing read operations involving the set of data memory cells, including applying at least one demarcation voltage to selected memory cells in the set while applying a pass voltage to unselected memory cells in the set;

instructions for determining a first count of the first dummy memory cells which have a threshold voltage above an upper checkpoint voltage, after the erasing of the one or more memory cells in the set of data memory cells and the read operations; and instructions for setting a second control gate voltage, lower than the first control gate voltage, for the first dummy memory cells during a subsequent erase operation involving one or more memory cells in the set of data memory cells, if the first count exceeds a threshold; and a processor operable to execute the set of instructions.

22. The memory controller of claim 21, wherein the set of instructions further comprises:

instructions for tracking a number of the read operations and triggering the instructions for determining the first count based on the number of the read operations.

23. The memory controller of claim 21, wherein the set of instructions further comprises:

instructions for tracking a number of program-erase cycles experienced by the set of data memory cells and triggering the instructions for determining the first count based on the number of program-erase cycles.

* * * * *